United States Patent
Kasai

(10) Patent No.: US 11,088,252 B2
(45) Date of Patent: Aug. 10, 2021

(54) THREE-DIMENSIONAL MEMORY DEVICE WITH A SILICON CARBON NITRIDE INTERFACIAL LAYER IN A CHARGE STORAGE LAYER AND METHODS OF MAKING THE SAME

(71) Applicant: SANDISK TECHNOLOGIES LLC, Addison, TX (US)

(72) Inventor: Yuki Kasai, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 16/291,220

(22) Filed: Mar. 4, 2019

(65) Prior Publication Data
US 2020/0287007 A1   Sep. 10, 2020

(51) Int. Cl.
| | |
|---|---|
| H01L 29/423 | (2006.01) |
| H01L 27/1157 | (2017.01) |
| H01L 27/11582 | (2017.01) |
| H01L 29/51 | (2006.01) |
| H01L 21/02 | (2006.01) |
| H01L 21/28 | (2006.01) |

(52) U.S. Cl.
CPC ...... *H01L 29/4234* (2013.01); *H01L 21/0214* (2013.01); *H01L 21/0217* (2013.01); *H01L 21/02164* (2013.01); *H01L 21/02167* (2013.01); *H01L 27/1157* (2013.01); *H01L 27/11582* (2013.01); *H01L 29/40117* (2019.08); *H01L 29/512* (2013.01); *H01L 29/518* (2013.01)

(58) Field of Classification Search
None
See application file for complete search history.

(56) References Cited

U.S. PATENT DOCUMENTS

| | | | |
|---|---|---|---|
| 5,915,167 A | 6/1999 | Leedy | |
| 9,613,977 B2 | 4/2017 | Sharangpani et al. | |
| 2004/0183202 A1* | 9/2004 | Usami | H01L 23/5329 257/762 |
| 2009/0085218 A1 | 4/2009 | Shim | |
| 2009/0091040 A1 | 4/2009 | Uchida et al. | |
| 2014/0042516 A1 | 2/2014 | Kim et al. | |

(Continued)

OTHER PUBLICATIONS

Endoh et al., "Novel Ultra High Density Memory With a Stacked-Surrounding Gate Transistor (S-SGT) Structured Cell", IEDM Proc. (2001) 33-36.

(Continued)

*Primary Examiner* — Mounir S Amer
(74) *Attorney, Agent, or Firm* — The Marbury Law Group PLLC

(57) ABSTRACT

An alternating stack of insulating layers and spacer material layers is formed located over a substrate. The spacer material layers are formed as, or are subsequently replaced with, electrically conductive layers. Memory openings are formed through the alternating stack. A memory stack structure is formed within each memory opening. Each memory stack structure includes a memory film and a vertical semiconductor channel. A silicon nitride layer is formed over a sidewall of each memory opening as a component of the memory film. A silicon carbon nitride interfacial layer is formed on the silicon nitride layer, and a tunneling dielectric layer is formed on the silicon carbon nitride interfacial layer.

19 Claims, 29 Drawing Sheets

(56) References Cited

U.S. PATENT DOCUMENTS

| | | |
|---|---|---|
| 2015/0137263 A1* | 5/2015 | Lee .................. H01L 21/02233 |
| | | 257/401 |
| 2015/0318333 A1 | 11/2015 | Narayanan et al. |
| 2016/0111291 A1 | 4/2016 | Kim et al. |
| 2016/0204059 A1 | 7/2016 | Fukuo et al. |
| 2017/0110470 A1* | 4/2017 | Rabkin ............. H01L 27/11582 |
| 2017/0365522 A1 | 12/2017 | Jeong et al. |
| 2017/0373079 A1 | 12/2017 | Sharangpani et al. |
| 2018/0018263 A1 | 1/2018 | Cho et al. |
| 2018/0108664 A1 | 4/2018 | Lee et al. |
| 2018/0204881 A1 | 7/2018 | Sei et al. |
| 2018/0226567 A1 | 8/2018 | Lee et al. |

OTHER PUBLICATIONS

Otake et al., "Theoretical studies on the charge trap mechanism of Monos type memories—Relationship between atomistic information and program/erase actions", Microelectronic Engineering 86 (2009) 1849-1851.

Yamaguchi et al., "Atomistic Guiding Principles for MONOS-Type Memories with High Program/Erase Cycle Endurance", IEDM09-278 (2009).

* cited by examiner

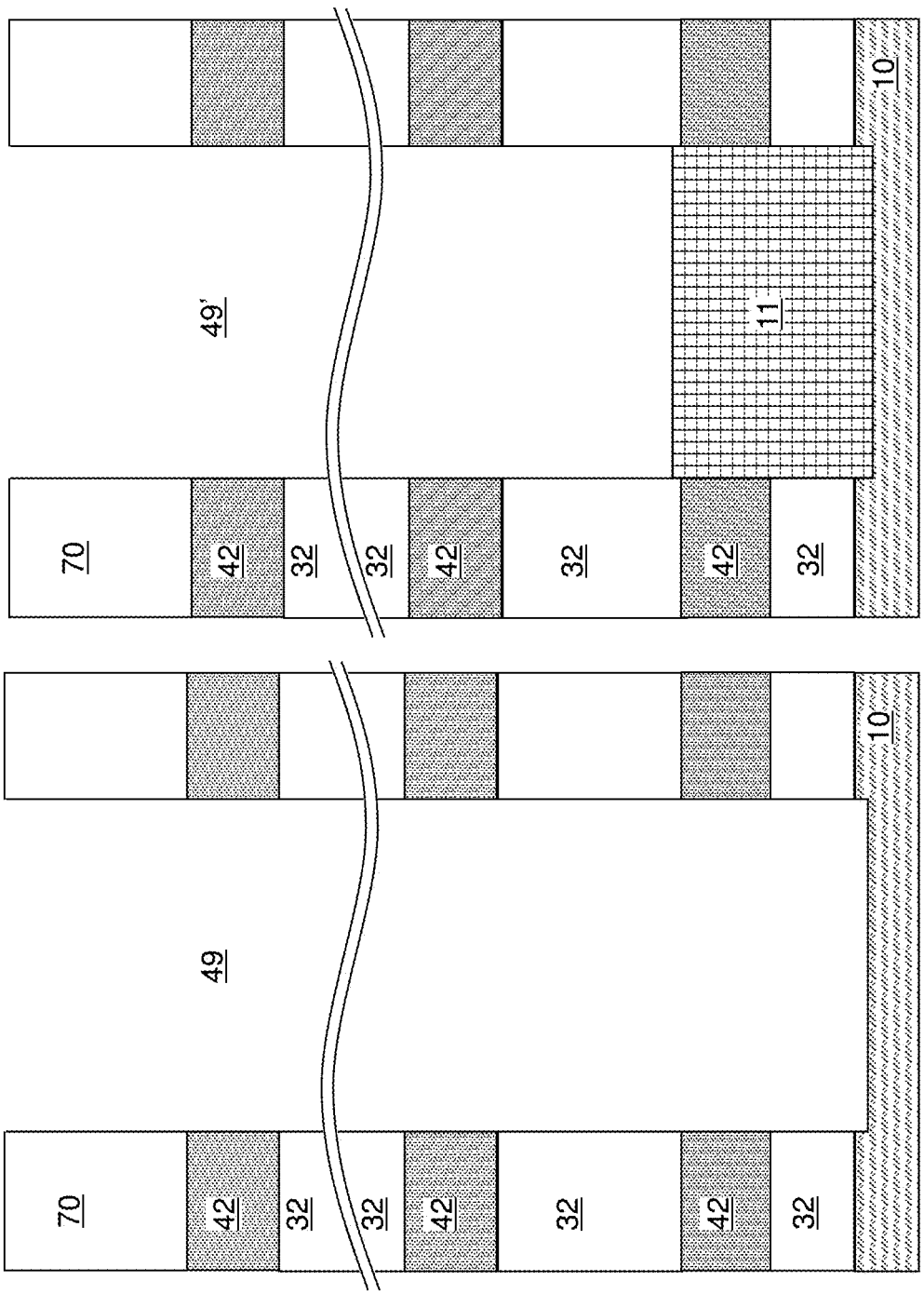

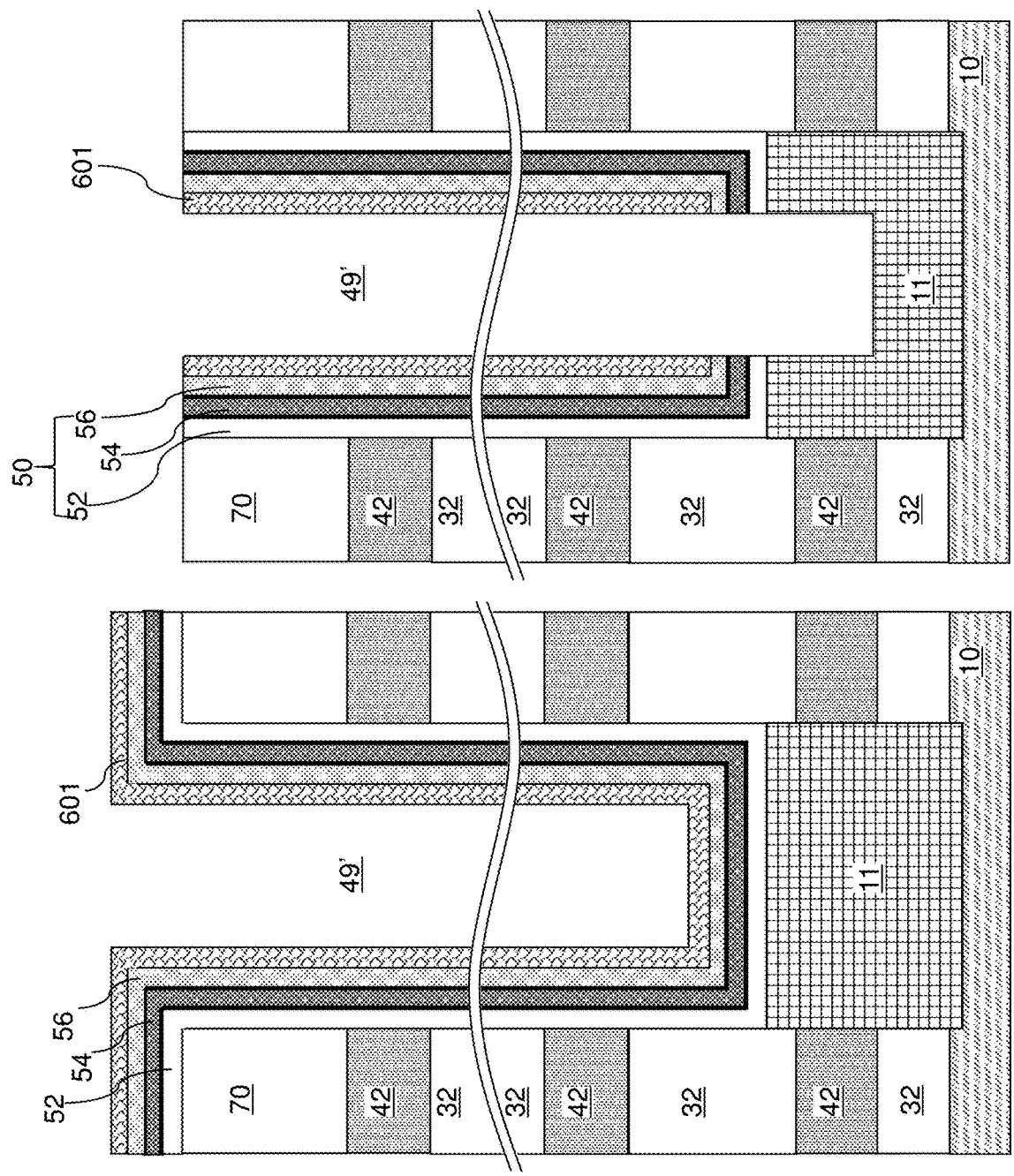

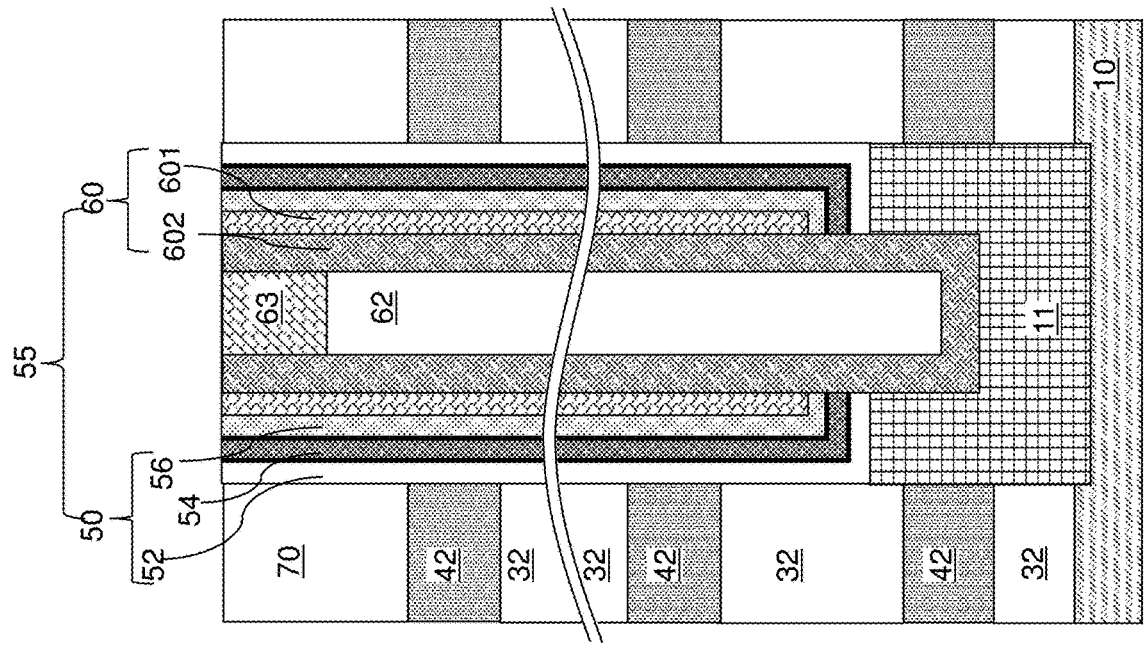
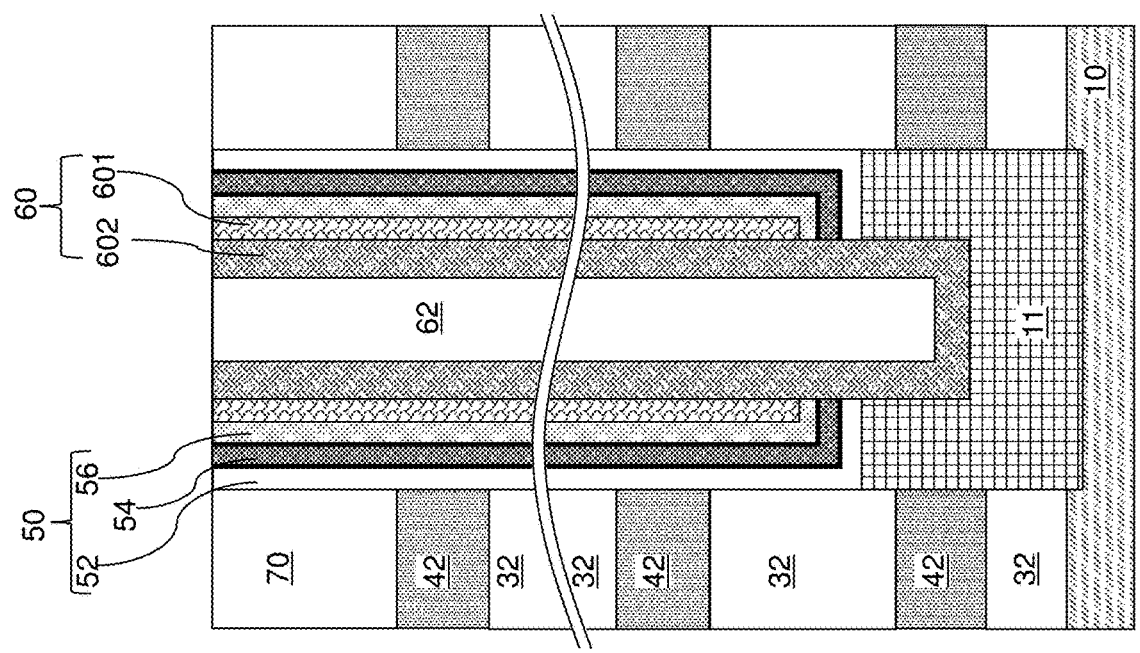

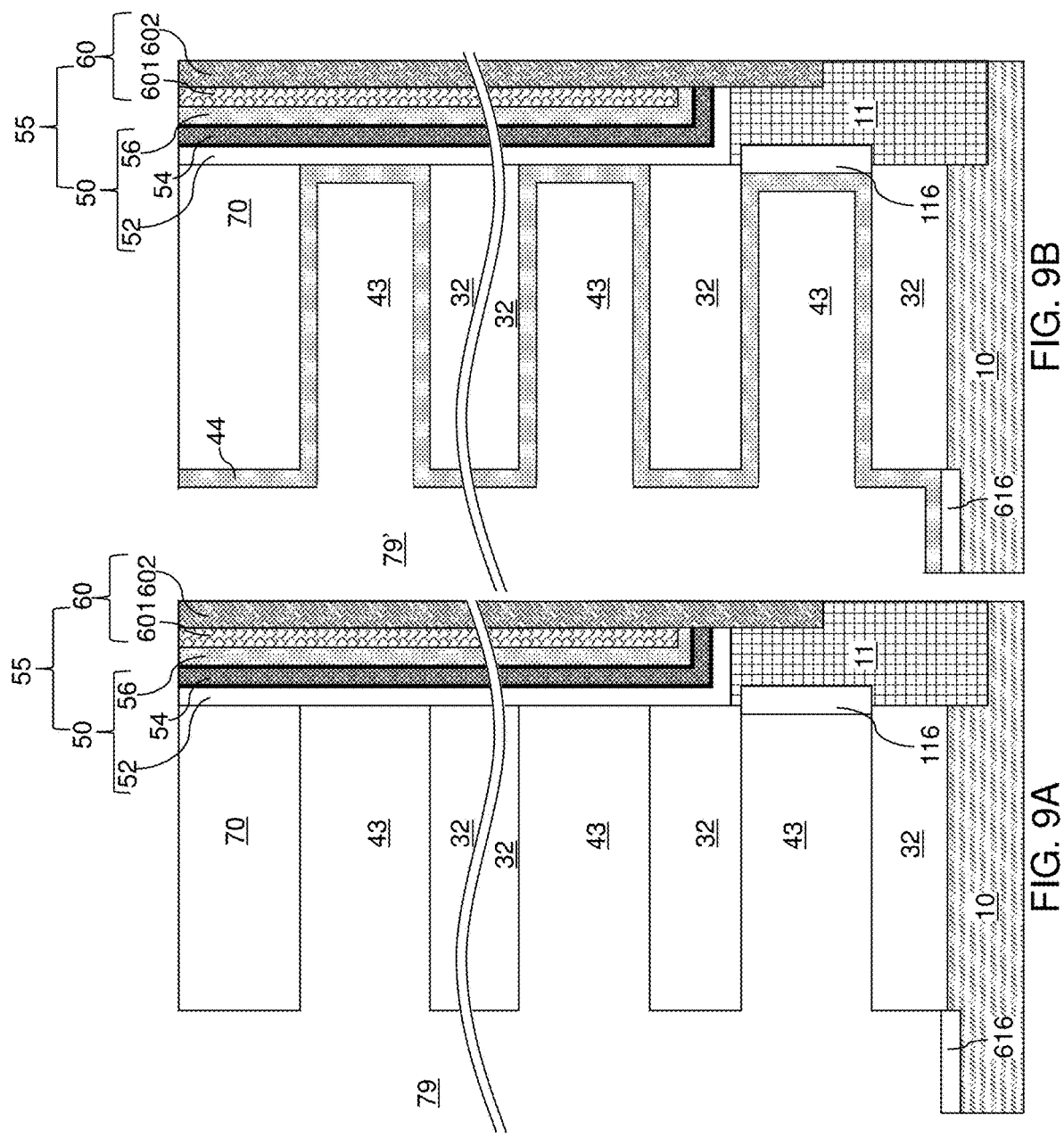

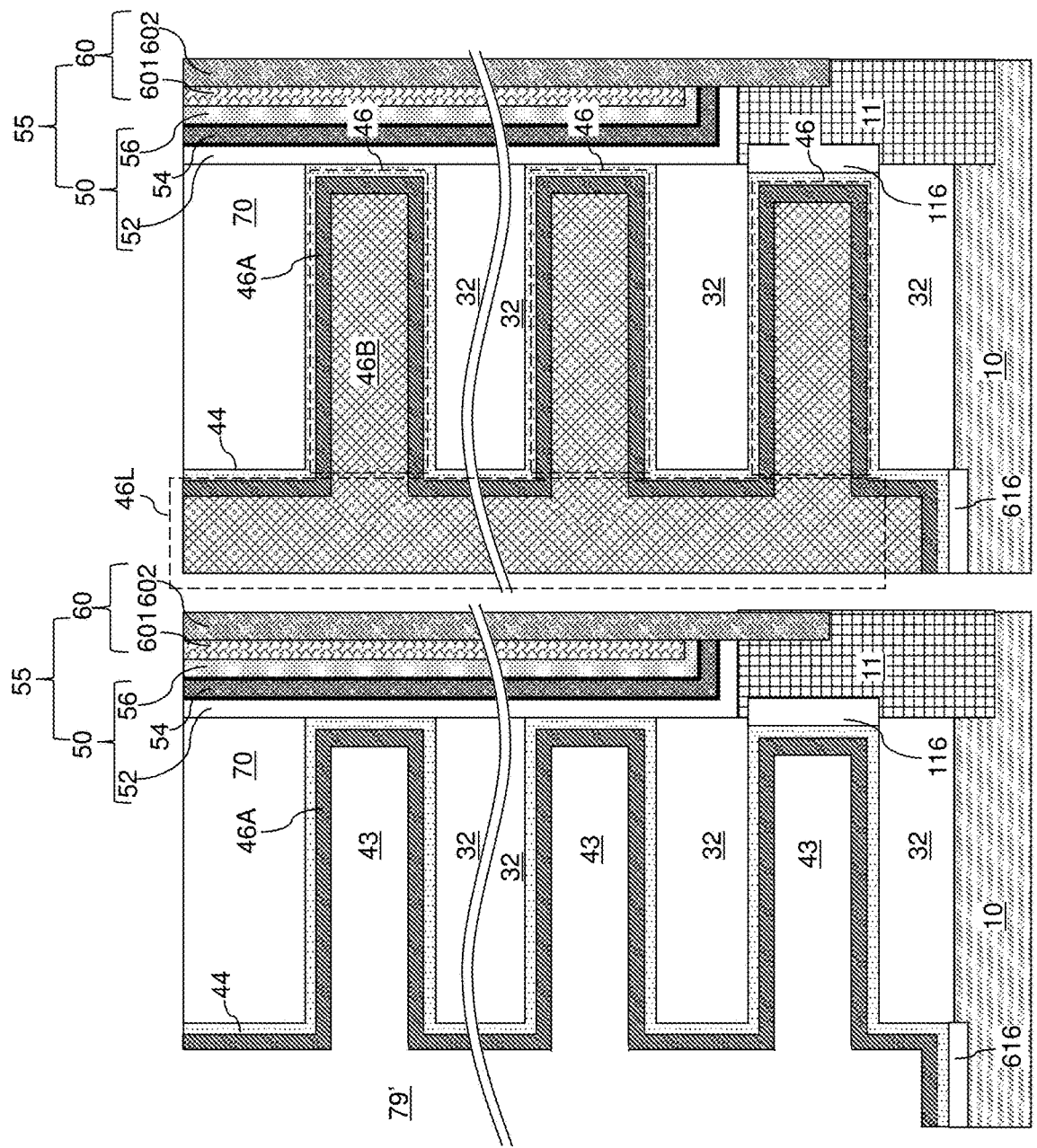

US 11,088,252 B2

1

THREE-DIMENSIONAL MEMORY DEVICE WITH A SILICON CARBON NITRIDE INTERFACIAL LAYER IN A CHARGE STORAGE LAYER AND METHODS OF MAKING THE SAME

FIELD

The present disclosure relates generally to the field of semiconductor devices, and particular to three-dimensional memory devices with a silicon carbon nitride interfacial layer in a charge storage layer and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36. used.

SUMMARY

According to an aspect of the present disclosure, a three-dimensional memory device is provided, which comprises: an alternating stack of insulating layers and electrically conductive layers located over a substrate; and memory stack structures extending through the alternating stack. Each of the memory stack structures comprises a memory film and a vertical semiconductor channel contacting an inner sidewall of the memory film. The memory film comprises a silicon nitride layer, a tunneling dielectric layer, and a silicon carbon nitride interfacial layer located between the silicon nitride layer and the tunneling dielectric layer.

According to another aspect of the present disclosure, a method of forming a three-dimensional memory device is provided, which comprises: forming an alternating stack of insulating layers and spacer material layers located over a substrate, wherein the spacer material layers are formed as, or are subsequently replaced with, electrically conductive layers; forming memory openings through the alternating stack; and forming a memory stack structure within each memory opening. Each memory stack structure comprises a memory film and a vertical semiconductor channel. Each memory film is formed by: forming a silicon nitride layer over a sidewall of a respective memory opening; forming a silicon carbon nitride interfacial layer on the silicon nitride layer; and forming a tunneling dielectric layer on the silicon carbon nitride interfacial layer.

BRIEF DESCRIPTION OF THE DRAWINGS

FIGS. 5A-5J are sequential schematic vertical cross-sectional views of a memory opening within the exemplary structure during formation of a memory stack structure, an optional dielectric core, and a drain region therein according to an embodiment of the present disclosure.

FIGS. 9A-9D are sequential vertical cross-sectional views of a region of the exemplary structure during formation of electrically conductive layers according to an embodiment of the present disclosure.

DETAILED DESCRIPTION

Figure 1:
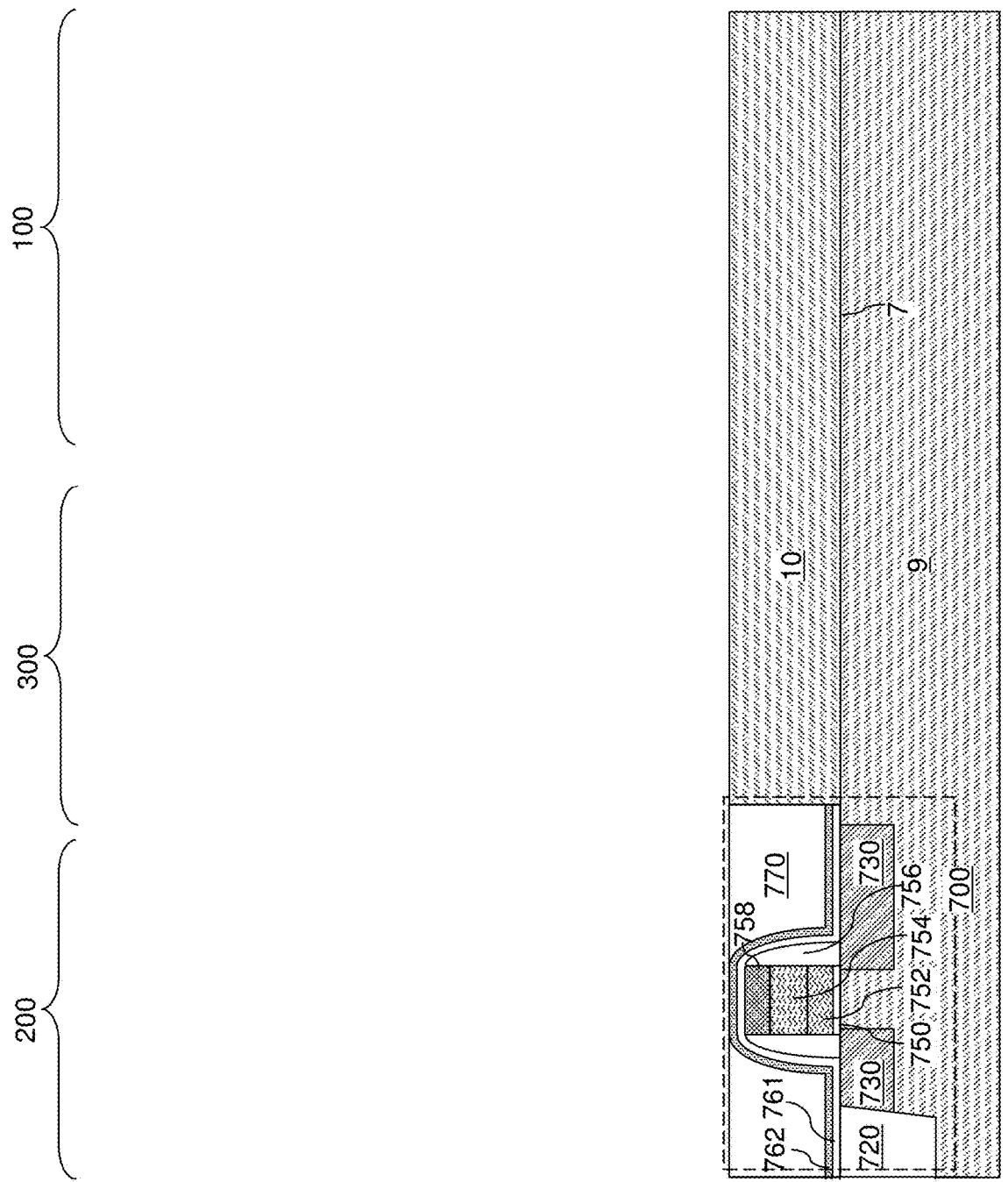
FIG. 1 is a schematic vertical cross-sectional view of an exemplary structure after formation of at least one peripheral device, a semiconductor material layer, and a gate dielectric layer according to an embodiment of the present disclosure.

As discussed above, the present disclosure is directed to three-dimensional memory devices with a silicon carbon nitride interfacial layer in a charge storage layer and methods of manufacturing the same, the various aspects of which are described below. Data retention after write/erase cycles is a factor in determining the reliability of three-dimensional vertical NAND devices. However, there is a trade-off between data retention of NAND memory elements in a fresh condition (i.e., without prior memory state cycling) and data retention of the NAND memory elements after multiple write/erase cycles. This is due to shifts in device characteristics caused by electrical stress generated during write/erase cycles. One of the models explaining degradation of write/erase data retention with cycling is based on detrapping of weak electron traps due to layer mixing between a silicon nitride layer that functions as a silicon nitride layer and a silicon oxide layer that functions as a tunneling dielectric layer or as a component of a blocking dielectric layer. When a silicon oxide/silicon nitride/silicon oxide (ONO) stack structure is used as a tunneling dielectric layer, first principle calculations show three defect models that can degrade the write/erase data retention. Especially, a silicon nitride-silicon oxide interface can provide a defect with two substitutional oxygen atoms at nitrogen atom sites. Formation of the defect is thought to be an irreversible reaction after application of write/erase stress. Various embodiments of the disclosure include inserting a thin SiCN film between the charge trapping layer and tunneling dielectric layer interface, thereby suppressing mixing of silicon nitride and silicon oxide and reducing degradation of write/erase data retention. The embodiments of the disclosure can be used to form various structures including a multilevel memory structure, non-limiting examples of which include semiconductor devices such as three-dimensional monolithic memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are used merely to identify similar elements, and different ordinals may be used across the specification and the claims of the instant disclosure. The same reference numerals refer to the same element or similar element. Unless otherwise indicated, elements having the same reference numerals are presumed to have the same composition. Unless otherwise indicated, a "contact" between elements refers to a direct contact between elements that provides an edge or a surface shared by the elements. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated using the various embodiments described herein.

Generally, a semiconductor die, or a semiconductor package, can include a memory chip. Each semiconductor package contains one or more dies (for example one, two, or four). The die is the smallest unit that can independently execute commands or report status. Each die contains one or more planes (typically one or two). Identical, concurrent operations can take place on each plane, although with some restrictions. Each plane contains a number of blocks, which are the smallest unit that can be erased by in a single erase operation. Each block contains a number of pages, which are the smallest unit that can be programmed, i.e., a smallest unit on which a read operation can be performed.

Referring to FIG. 1, an exemplary structure according to an embodiment of the present disclosure is illustrated, which can be used, for example, to fabricate a device structure containing vertical NAND memory devices. The exemplary structure includes a substrate (9, 10), which can be a semiconductor substrate. The substrate can include a substrate semiconductor layer 9 and an optional semiconductor material layer 10. The substrate semiconductor layer 9 maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0\times10^{-6}$ S/cm to $1.0\times10^{5}$ S/cm. As used herein, a "semiconductor material" refers to a material having electrical conductivity in the range from $1.0\times10^{-6}$ S/cm to $1.0\times10^{5}$ S/cm in the absence of electrical dopants therein, and is capable of producing a doped material having electrical conductivity in a range from 1.0 S/cm to $1.0\times10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0\times10^{5}$ S/cm. As used herein, an "insulator material" or a "dielectric material" refers to a material having electrical conductivity less than $1.0\times10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0\times10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0\times10^{-6}$ S/cm to $1.0\times10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate semiconductor layer 9. The at least one semiconductor device can include, for example, field effect transistors. For example, at least one shallow trench isolation structure 720 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (750, 752, 754, 758), each of which can include a gate dielectric 750, a gate electrode (752, 754), and a gate cap dielectric 758. The gate electrode (752, 754) may include a stack of a first gate electrode portion 752 and a second gate electrode portion 754. At least one gate spacer 756 can be formed around the at least one gate structure (750, 752, 754, 758) by depositing and anisotropically etching a dielectric liner. Active regions 730 can be formed in upper portions of the substrate semiconductor layer 9, for example, by introducing electrical dopants using the at least one gate structure (750, 752, 754, 758) as masking structures. Additional masks may be used as needed. The active region 730 can include source regions and drain regions of field effect transistors. A first dielectric liner 761 and a second dielectric liner 762 can be optionally formed. Each of the first and second dielectric liners (761, 762) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 761 can be a silicon oxide layer, and the second dielectric liner 762 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 770. In one embodiment the planarized top surface of the planarization dielectric layer 770 can be coplanar with a top surface of the dielectric liners (761, 762). Subsequently, the planarization dielectric layer 770 and the dielectric liners (761, 762) can be removed from an area to physically expose a top surface of the substrate semiconductor layer 9. As used herein, a surface is "physically exposed" if the surface is in physical contact with vacuum, or a gas phase material (such as air).

The optional semiconductor material layer 10, if present, can be formed on the top surface of the substrate semiconductor layer 9 prior to, or after, formation of the at least one semiconductor device 700 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be used for the semiconductor substrate layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 770 can be removed, for example, by chemical mechanical planarization (CMP). In this case, the semiconductor material layer 10 can have a top surface that is coplanar with the top surface of the planarization dielectric layer 770.

The region (i.e., area) of the at least one semiconductor device 700 is herein referred to as a peripheral device region 200. The region in which a memory array is subsequently formed is herein referred to as a memory array region 100. A contact region 300 for subsequently forming stepped terraces of electrically conductive layers can be provided between the memory array region 100 and the peripheral device region 200.

Figure 2:
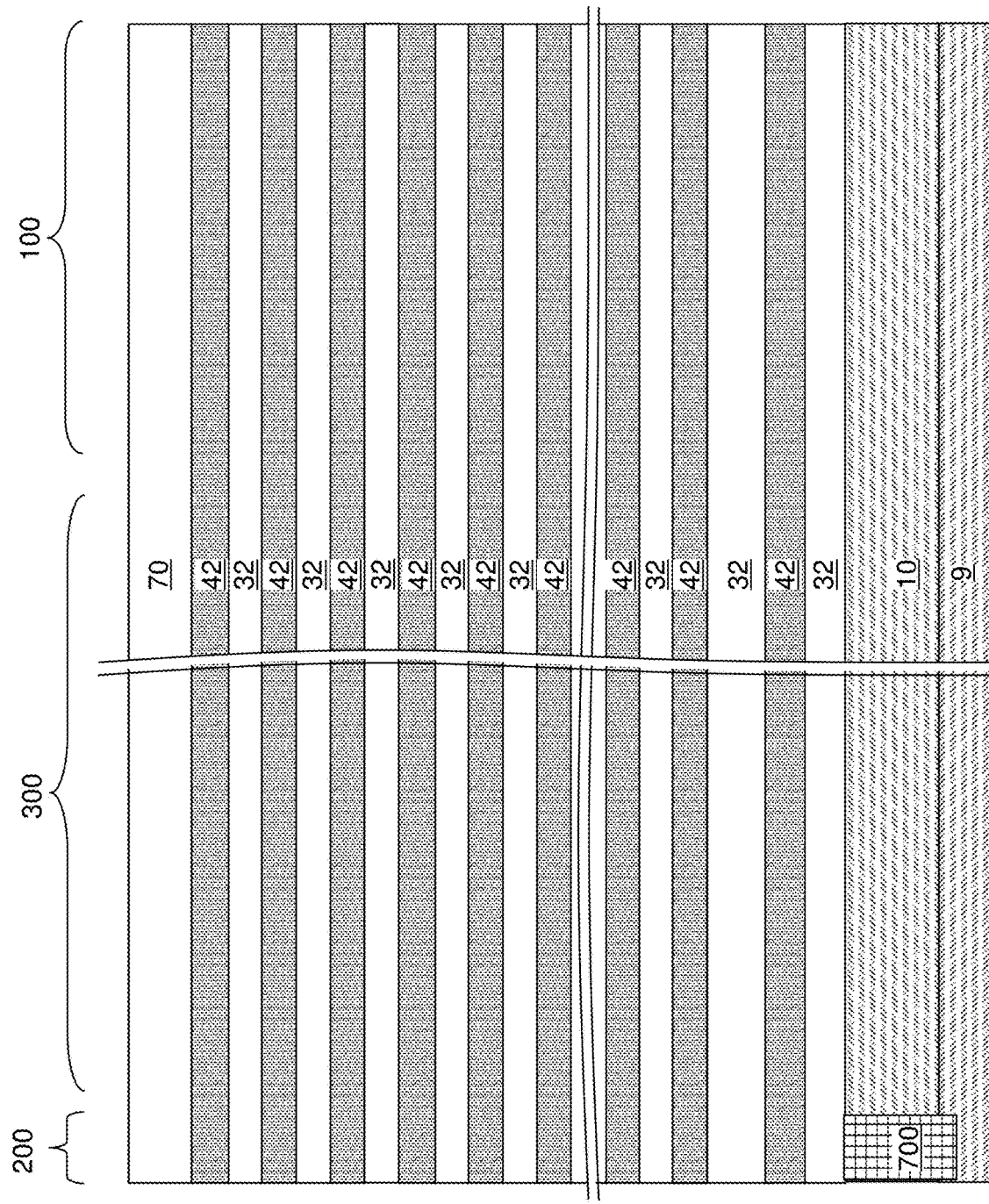
FIG. 2 is a schematic vertical cross-sectional view of the exemplary structure after formation of an alternating stack of insulating layers and sacrificial material layers according to an embodiment of the present disclosure.

Referring to FIG. 2, a stack of an alternating plurality of first material layers (which can be insulating layers 32) and second material layers (which can be sacrificial material layer 42) is formed over the top surface of the substrate (9, 10). As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be used for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is used for the insulating layers 32, tetraethyl orthosilicate (TEOS) can be used as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be used for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be used. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

While the present disclosure is described using an embodiment in which the spacer material layers are sacrificial material layers 42 that are subsequently replaced with electrically conductive layers, embodiments are expressly contemplated herein in which the sacrificial material layers are formed as electrically conductive layers. In this case, steps for replacing the spacer material layers with electrically conductive layers can be omitted.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be used for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Figure 3:
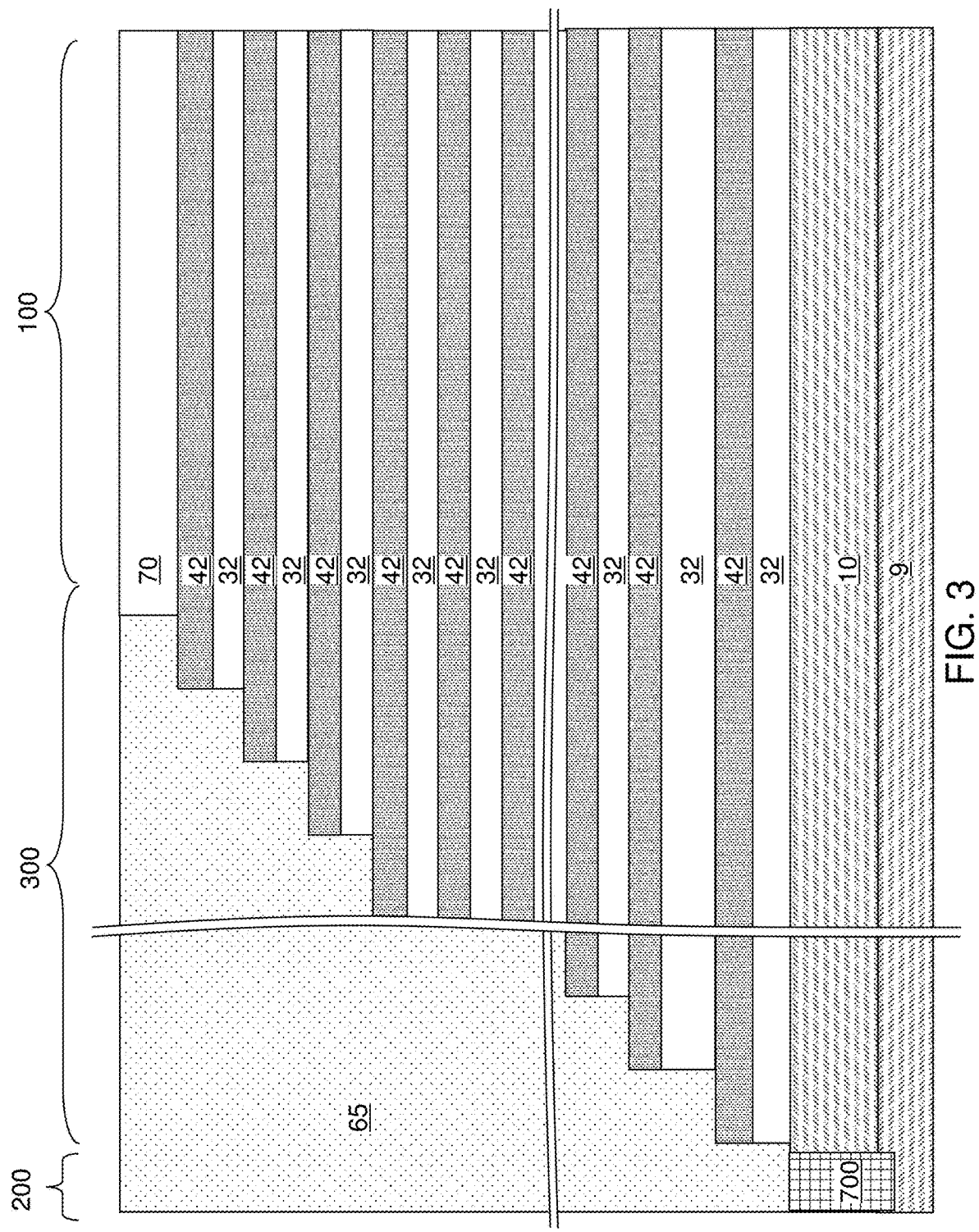
FIG. 3 is a schematic vertical cross-sectional view of the exemplary structure after formation of stepped terraces and a retro-stepped dielectric material portion according to an embodiment of the present disclosure.

Referring to FIG. 3, stepped surfaces are formed at a peripheral region of the alternating stack (32, 42), which is herein referred to as a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 42) are removed through formation of the stepped surfaces. A "stepped cavity" refers to a cavity having stepped surfaces.

The terrace region is formed in the contact region 300, which is located between the memory array region 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the alternating stack (32, 42) laterally extends farther than any overlying sacrificial material layer 42 within the alternating stack (32, 42) in the terrace region. The terrace region includes stepped surfaces of the alternating stack (32, 42) that continuously extend from a bottommost layer within the alternating stack (32, 42) to a topmost layer within the alternating stack (32, 42).

Each vertical step of the stepped surfaces can have the height of one or more pairs of an insulating layer 32 and a sacrificial material layer. In one embodiment, each vertical step can have the height of a single pair of an insulating layer 32 and a sacrificial material layer 42. In another embodiment, multiple "columns" of staircases can be formed along a first horizontal direction hd1 such that each vertical step has the height of a plurality of pairs of an insulating layer 32 and a sacrificial material layer 42, and the number of columns can be at least the number of the plurality of pairs. Each column of staircase can be vertically offset one from another such that each of the sacrificial material layers 42 has a physically exposed top surface in a respective column of staircases. In the illustrative example, two columns of staircases are formed for each block of memory stack structures to be subsequently formed such that one column of staircases provide physically exposed top surfaces for odd-numbered sacrificial material layers 42 (as counted from the bottom) and another column of staircases provide physically exposed top surfaces for even-numbered sacrificial material layers (as counted from the bottom). Configurations using three, four, or more columns of staircases with a respective set of vertical offsets among the physically exposed surfaces of the sacrificial material layers 42 may also be used. Each sacrificial material layer 42 has a greater lateral extent, at least along one direction, than any overlying sacrificial material layers 42 such that each physically exposed surface of any sacrificial material layer 42 does not have an overhang. In one embodiment, the vertical steps within each column of staircases may be arranged along the first horizontal direction hd1, and the columns of staircases may be arranged along a second horizontal direction hd2 that is perpendicular to the first horizontal direction hd1. In one embodiment, the first horizontal direction hd1 may be perpendicular to the boundary between the memory array region 100 and the contact region 300.

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is used for the retro-stepped dielectric material portion 65, the silicon oxide of the retro-stepped dielectric material portion 65 may, or may not, be doped with dopants such as B, P, and/or F.

Optionally, drain select level isolation structures 72 can be formed through the insulating cap layer 70 and a subset of the sacrificial material layers 42 located at drain select levels. The drain select level isolation structures 72 can be formed, for example, by forming drain select level isolation trenches and filling the drain select level isolation trenches with a dielectric material such as silicon oxide. Excess portions of the dielectric material can be removed from above the top surface of the insulating cap layer 70.

Figure 4A:
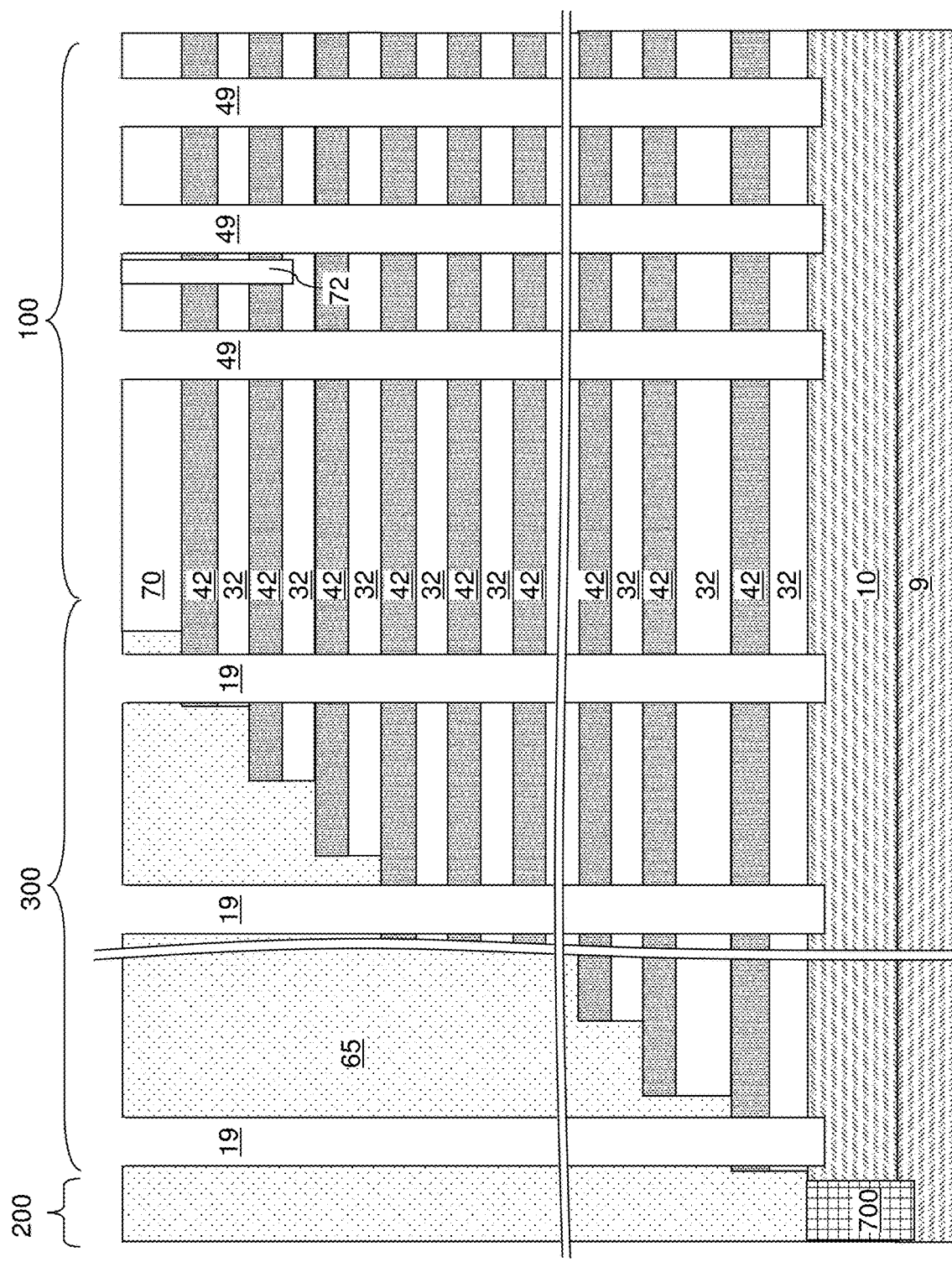
FIG. 4A is a schematic vertical cross-sectional view of the exemplary structure after formation of memory openings and support openings according to an embodiment of the present disclosure.
Figure 4B:
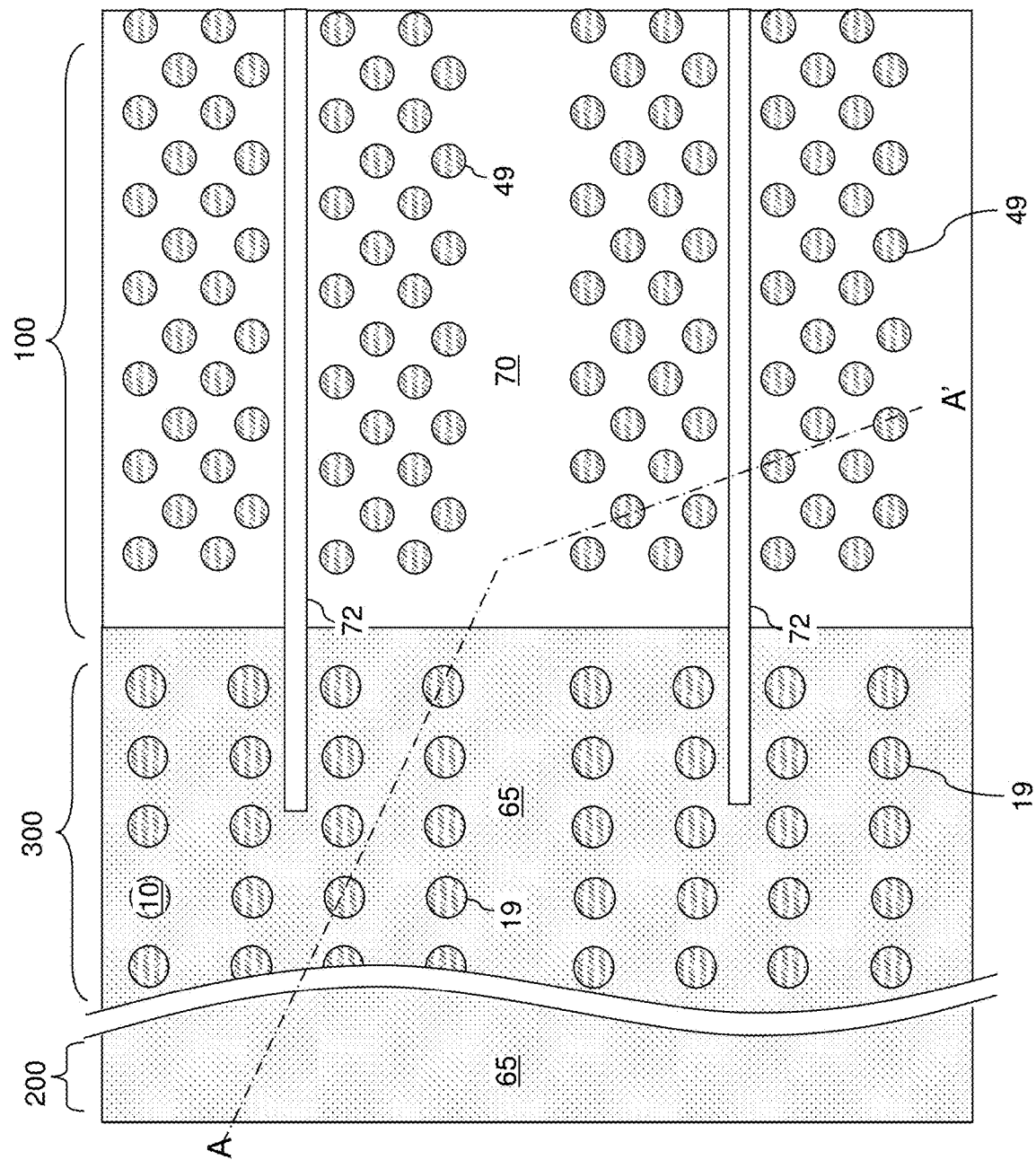
FIG. 4B is a top-down view of the exemplary structure of FIG. 4A. The vertical plane A-A' is the plane of the cross-section for FIG. 4A.

Referring to FIGS. 4A and 4B, a lithographic material stack (not shown) including at least a photoresist layer can be formed over the insulating cap layer 70 and the retro-stepped dielectric material portion 65, and can be lithographically patterned to form openings therein. The openings include a first set of openings formed over the memory array region 100 and a second set of openings formed over the contact region 300. The pattern in the lithographic material stack can be transferred through the insulating cap layer 70 or the retro-stepped dielectric material portion 65, and through the alternating stack (32, 42) by at least one anisotropic etch that uses the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the insulating cap layer 70 and the entirety of the alternating stack (32, 42) in the memory array region 100. The support openings 19 are formed through the retro-stepped dielectric material portion 65 and the portion of the alternating stack (32, 42) that underlie the stepped surfaces in the contact region 300.

The memory openings 49 extend through the entirety of the alternating stack (32, 42). The support openings 19 extend through a subset of layers within the alternating stack (32, 42). The chemistry of the anisotropic etch process used to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can extend from the top surface of the alternating stack (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth can be, for example, in a range from 1 nm to 50 nm, although lesser and greater recess depths can also be used. The overetch is optional, and may be omitted. If the overetch is not performed, the bottom surfaces of the memory openings 49 and the support openings 19 can be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the contact region 300. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 and the support openings 19 can be extend to a top surface of the substrate semiconductor layer 9.

FIGS. 5A-5J illustrate structural changes in a memory opening 49, which is one of the memory openings 49 in the exemplary structure of FIGS. 4A and 4B. The same structural change occurs simultaneously in each of the other memory openings 49 and in each support opening 19.

Referring to FIG. 5A, a memory opening 49 in the exemplary device structure of FIGS. 4A and 4B is illustrated. The memory opening 49 extends through the insulating cap layer 70, the alternating stack (32, 42), and optionally into an upper portion of the semiconductor material layer 10. At this processing step, each support opening 19 can extend through the retro-stepped dielectric material portion 65, a subset of layers in the alternating stack (32, 42), and optionally through the upper portion of the semiconductor material layer 10. The recess depth of the bottom surface of each memory opening with respect to the top surface of the semiconductor material layer 10 can be in a range from 0 nm to 30 nm, although greater recess depths can also be used. Optionally, the sacrificial material layers 42 can be laterally recessed partially to form lateral recesses (not shown), for example, by an isotropic etch.

Referring to FIG. 5B, an optional pedestal channel portion (e.g., an epitaxial pedestal) 11 can be formed at the bottom portion of each memory opening 49 and each support openings 19, for example, by selective epitaxy. Each pedestal channel portion 11 comprises a single crystalline semiconductor material in epitaxial alignment with the single crystalline semiconductor material of the semiconductor material layer 10. In one embodiment, the pedestal channel portion 11 can be doped with electrical dopants of the same conductivity type as the semiconductor material layer 10. In one embodiment, the top surface of each pedestal channel portion 11 can be formed above a horizontal plane including the top surface of a sacrificial material layer 42. In this case, at least one source select gate electrode can be subsequently formed by replacing each sacrificial material layer 42 located below the horizontal plane including the top surfaces of the pedestal channel portions 11 with a respective conductive material layer. The pedestal channel portion 11 can be a portion of a transistor channel that extends between a source region to be subsequently formed in the substrate (9, 10) and a drain region to be subsequently formed in an upper portion of the memory opening 49. A memory cavity 49' is present in the unfilled portion of the memory opening 49 above the pedestal channel portion 11. In one embodiment, the pedestal channel portion 11 can comprise single crystalline silicon. In one embodiment, the pedestal channel portion 11 can have a doping of the first conductivity type, which is the same as the conductivity type of the semiconductor material layer 10 that the pedestal channel portion contacts. If a semiconductor material layer 10 is not present, the pedestal channel portion 11 can be formed directly on the substrate semiconductor layer 9, which can have a doping of the first conductivity type.

Figure 5C:
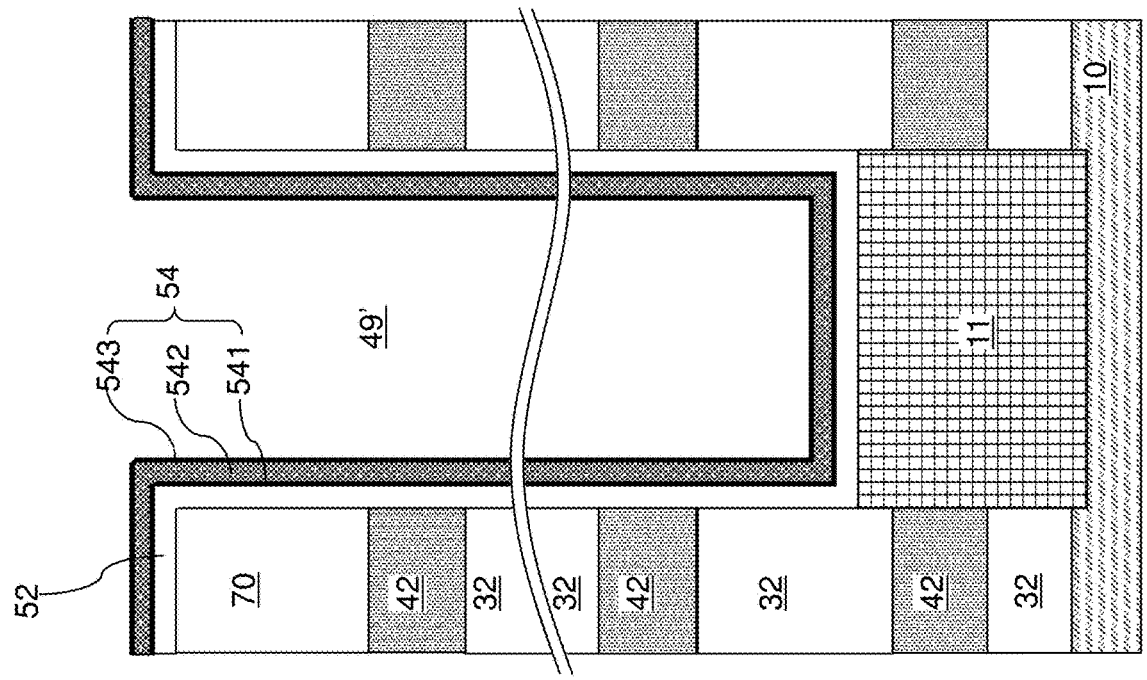

Referring to FIG. 5C, a blocking dielectric layer 52 can be formed on the sidewalls of the memory openings 49 and on top surfaces of the pedestal channel portions 10 as a continuous material layer. The blocking dielectric layer 52 can include a silicon oxide layer that is physically exposed to unfilled volumes of the memory openings 49. In one embodiment, the blocking dielectric layer 52 can consist of a silicon oxide layer. Alternatively, the blocking dielectric layer 52 can include a layer stack of a dielectric metal oxide layer (such as an aluminum oxide layer) and a silicon oxide layer. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride. Each component layer of the blocking dielectric layer 52 can be deposited by a conformal deposition process such as chemical vapor deposition or atomic layer deposition. The thickness of the blocking dielectric layer 52 can be in a range from 2 nm to 20 nm, although lesser and greater thicknesses can also be used.

An amorphous carbon layer 541' can be optionally formed on the physically exposed surface of the blocking dielectric layer 52. The amorphous carbon layer 541' can be formed by exposing the surfaces of the blocking dielectric layer 52 to an environment in which a carbon precursor gas can nucleate carbon atoms. For example, the exemplary structure can be disposed within a vacuum enclosure of a process chamber and heated to a first elevated temperature, which can be in a range from 400 degrees Celsius to 1,000 degrees Celsius. After the process chamber is pumped down to a base pressure less than 10 mTorr, such as less than 1 mTorr, a carbon precursor gas can be flowed into the process chamber and maintained at a pressure that is sufficiently high to induce nucleation of carbon atoms on the physically exposed surfaces of the blocking dielectric layer 52. The carbon precursor gas can include at least one of methane ($CH_4$), acetylene ($C_2H_2$), ethylene ($C_2H_4$), ethane ($C_2H_6$), propadiene ($C_3H_4$), propylene ($C_3H_6$), and/or propane ($C_3H_8$). The partial pressure of the carbon precursor gas during nucleation of carbon atoms can be in a range from 1 mTorr to 100 mTorr, such as from 2 mTorr to 50 mTorr, although lesser and greater partial pressures can also be used. The duration of the nucleation process can be selected such that the thickness of the amorphous carbon layer 541' is in a range from 0.2 nm to 1 nm, although lesser and greater thicknesses can also be used. The amorphous carbon layer 541' is optional, and thus, may, or may not, be formed.

Figure 5D:
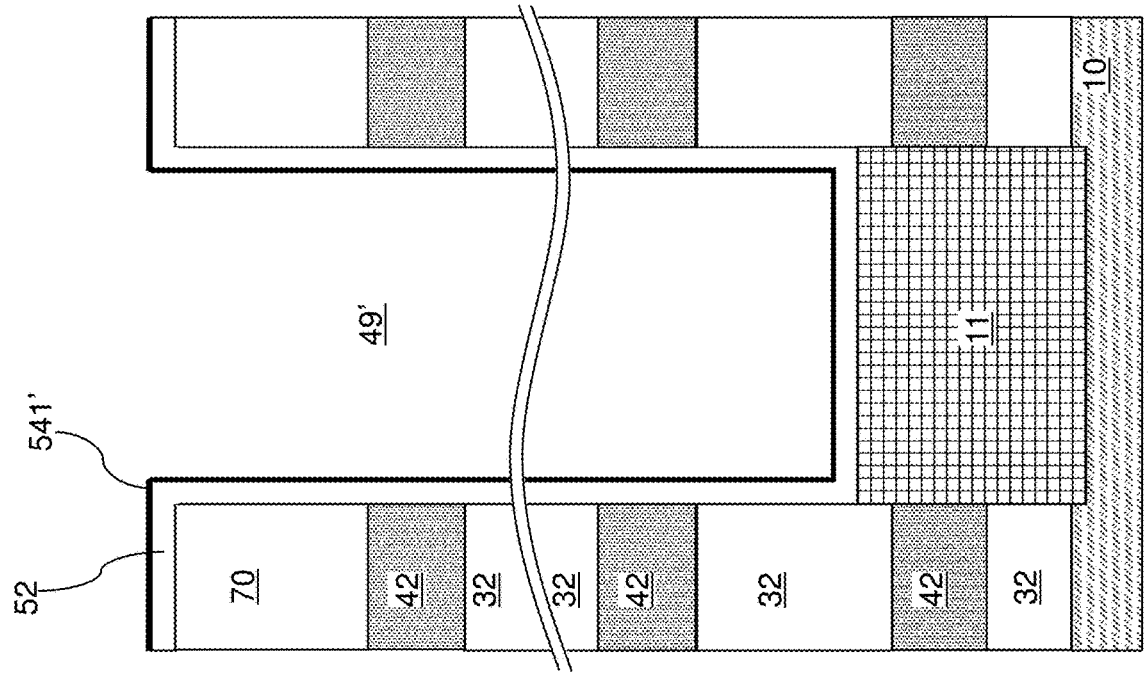

Referring to FIG. 5D, if the amorphous carbon layer 541' is present, silicon can be nucleated on the amorphous carbon layer 541'. A silicon precursor gas can be flowed into the process chamber containing the exemplary structure, and silicon atoms can nucleate on the amorphous carbon layer 541'. For example, the exemplary structure can be heated to a second elevated temperature, which can be in a range from 500 degrees Celsius to 1,000 degrees Celsius. After the process chamber is pumped down to a base pressure less than 10 mTorr, such as less than 1 mTorr, a silicon precursor gas can be flowed into the process chamber and maintained at a pressure that is sufficiently high to induce nucleation of silicon atoms on the physically exposed surfaces of the amorphous carbon layer 541'. The silicon precursor gas can include at least one of silane ($SiH_4$), chlorosilanes (such as $SiH_2Cl_2$, $SiHCl_3$, $SiCl_4$), disilane ($Si_2H_6$), chloridisilanes, trisilane, and chloritrisilanes, or an organic silicon-containing precursor gas that deposits silicon and optionally carbon upon decomposition. The partial pressure of the silicon precursor gas during nucleation of silicon atoms can be in a range from 1 mTorr to 100 mTorr, such as from 2 mTorr to 50 mTorr, although lesser and greater partial pressures can also be used. A silicon layer may be formed over the amorphous carbon layer 541', or an alloy of silicon and carbon can be formed on the blocking dielectric layer 52 by reaction of silicon atoms with carbon atoms in the amorphous carbon layer 541'. The duration of the silicon nucleation process can be selected such that the thickness of a layer including the carbon atoms from the amorphous carbon layer 541' and silicon atoms derived from nucleation is in a range from 0.4 nm to 1.5 nm, although lesser and greater thicknesses can also be used. In case an amorphous carbon layer 541' is not used, the silicon nucleation step may be omitted.

The layer including the carbon atoms and silicon atoms can be converted into a backside silicon carbon nitride interfacial layer 541 including a silicon carbon nitride material. As used herein, a silicon carbon nitride material includes a compound having a composition of $SiC_\alpha N_\beta$, in which $\alpha$ is in a range from ⅓ to 1 and $\beta$ is in a range ⅓ to ⅔. A nitridation gas such as ammonia can be flowed into the process chamber containing the exemplary structure, and the layer including the carbon atoms and silicon atoms can be converted into the backside silicon carbon nitride interfacial layer 541 by a thermal nitridation process. For example, the exemplary structure can be heated to a third elevated temperature, which can be in a range from 700 degrees Celsius to 1,000 degrees Celsius. After the process chamber is pumped down to a base pressure less than 10 mTorr, such as less than 1 mTorr, a nitridation gas can be flowed into the process chamber and maintained at a pressure that is sufficiently high to induce nitridation of the layer including the carbon atoms and silicon atoms. The partial pressure of the nitridation gas (such as ammonia) during the nitridation process can be in a range from 1 mTorr to 100 mTorr, such as from 2 mTorr to 50 mTorr, although lesser and greater partial pressures can also be used. The duration of the silicon nucleation process can be selected such that the entirety of the layer including the carbon atoms from the amorphous carbon layer 541' and silicon atoms derived from nucleation is converted into a silicon carbon nitride layer, i.e., the backside silicon carbon nitride interfacial layer 541. The backside silicon carbon nitride interfacial layer 541 can be formed directly on an inner sidewall of the blocking dielectric layer 52. The thickness of the backside silicon carbon nitride interfacial layer 541 can be in a range from 0.6 nm to 2 nm, such as from 0.8 nm to 1.5 nm, although lesser and greater thicknesses can also be used. In case an amorphous carbon layer 541' is not used, the nitridation process may be omitted.

Subsequently, a silicon nitride layer 542 can be formed over the blocking dielectric layer 52. The silicon nitride layer 542 can be formed directly on the backside silicon carbon nitride interfacial layer 541 or directly on the blocking dielectric layer 52 in case a backside silicon carbon nitride interfacial layer is not used. The silicon nitride layer 542 can be deposited as a continuous conformal material layer using a conformal deposition process such as a low pressure chemical vapor deposition process. The silicon nitride layer 542 can be formed directly on the backside silicon carbon nitride interfacial layer 52. The thickness of the silicon nitride layer 542 can be in a range from 3 nm to 10 nm, such as from 4 nm to 6 nm, although lesser and greater thicknesses can also be used.

A silicon carbon nitride interfacial layer 543 can be formed directly on the silicon nitride layer 542. For example, carbon atoms can be adsorbed on the physically exposed surfaces of the silicon nitride layer 542 by subjecting the surface of the silicon nitride layer 542 to an ambient that includes a carbon precursor gas. For example, the exemplary structure can be heated to an elevated temperature, which can be in a range from 200 degrees Celsius to 800 degrees Celsius. After the process chamber is pumped down to a base pressure less than 10 mTorr, such as less than 1 mTorr, a carbon precursor gas can be flowed into the process chamber and maintained at a pressure that is sufficiently high to induce adsorption of carbon atoms on the physically exposed surfaces of the blocking dielectric layer 52. The carbon precursor gas can include at least one of methane ($CH_4$), acetylene ($C_2H_2$), ethylene ($C_2H_4$), ethane ($C_2H_6$), propadiene ($C_3H_4$), propylene ($C_3H_6$), and/or propane ($C_3H_8$). The partial pressure of the carbon precursor gas during adsorption of carbon atoms can be in a range from 1 mTorr to 100 mTorr, such as from 2 mTorr to 50 mTorr, although lesser and greater partial pressures can also be used. The duration of the adsorption process can be selected such that the thickness of the adsorbed carbon layer is in a range from 0.2 nm to 1 nm, although lesser and greater thicknesses can also be used.

The adsorbed carbon atoms can be subjected to an ambient including a silicon precursor gas at a reaction temperature that induces reaction of silicon atoms in the silicon precursor gas, the adsorbed carbon atoms, and nitrogen atoms at a surface of the silicon nitride layer 542. For example, the exemplary structure in the process chamber can be heated to the reaction temperature, which can be in a range from 600 degrees Celsius to 1,000 degrees Celsius. A silicon precursor gas can be flowed into the process chamber containing the exemplary structure at a low partial pressure, which can be in a range from 0.1 mTorr to 5 mTorr, such as from 0.2 mTorr to 1.0 mTorr, although lesser and greater partial pressures can also be used. The partial pressure of the silicon precursor gas is maintained at a level that limits the thickness of adsorbed silicon atoms below 1 nm. A carrier gas such as nitrogen can be used to maintain the total pressure in the process chamber in a range from 5 mTorr to 100 mTorr. The silicon precursor gas can include at least one of silane ($SiH_4$), chlorosilanes (such as $SiH_2Cl_2$, $SiHCl_3$, $SiCl_4$), disilane ($Si_2H_6$), chloridisilanes, trisilane, and chloritrisilanes, or an organic silicon-containing precursor gas that deposits silicon and optionally carbon upon decomposition. A silicon carbon nitride interfacial layer 543 can be formed by reaction of nitrogen atoms at a surface of the silicon nitride layer 542, the adsorbed carbon atoms, and adsorbed silicon atoms. The thickness of the silicon carbon nitride interfacial layer 543 can be in a range from 0.6 nm to 2 nm, such as from 0.8 nm to 1.5 nm, although lesser and greater thicknesses can also be used.

The set of the optional backside silicon carbon nitride interfacial layer 541, the silicon nitride layer 542, and the silicon carbon nitride interfacial layer 543 constitutes a charge storage layer 54, which is used to store electrical charges therein.

Each of the backside silicon carbon nitride interfacial layer 541 and the silicon carbon nitride interfacial layer 543 can include sufficient silicon atoms and carbon atoms such that the materials of the backside silicon carbon nitride interfacial layer 541 and the silicon carbon nitride interfacial layer 543 are semiconducting. In other words, each of the backside silicon carbon nitride interfacial layer 541 and the silicon carbon nitride interfacial layer 543 can have respective electrical conductivity in a range from $1.0 \times 10^{-6}$ S/cm to $1.0 \times 10^5$ S/cm. In various embodiments, each of the backside silicon carbon nitride interfacial layer 541 and the silicon carbon nitride interfacial layer 543 can include nitrogen atoms at an atomic concentration less than 20%, such as less than 15%, such as less than 12%, such as 10%. In various embodiments, each of the backside silicon carbon nitride interfacial layer 541 and the silicon carbon nitride interfacial layer 543 can include nitrogen atoms at an atomic concentration in a range from 5% to 15%. In various embodiments, each of the backside silicon carbon nitride interfacial layer 541 and the silicon carbon nitride interfacial layer 543 can include carbon atoms at an atomic concentration greater than 30%, such as greater than 40%, such as greater than 50%, such as 55%. In various embodiments, each of the backside silicon carbon nitride interfacial layer 541 and the silicon carbon nitride interfacial layer 543 can include carbon atoms at an atomic concentration in a range from 30% to 70%, such as in a range from 40% to 65%, such as in a range from 50% to 60%. In various embodiments, each of the backside silicon carbon nitride interfacial layer 541 and the silicon carbon nitride interfacial layer 543 can include silicon atoms at an atomic concentration greater than 25%, such as greater than 30% such as 35%. In various embodiments, each of the backside silicon carbon nitride interfacial layer 541 and the silicon carbon nitride interfacial layer 543 can include carbon atoms at an atomic concentration in a range from 25% to 45%, such as from 30% to 40%. In one embodiment, the percentage of silicon atoms can be greater than the percentage of nitrogen atoms and lesser than the percentage of carbon atoms in each of the backside silicon carbon nitride interfacial layer 541 and the silicon carbon nitride interfacial layer 543.

Referring to FIG. 5E, a tunneling dielectric layer 56 can be deposited directly on the silicon carbon nitride interfacial layer 543 by a conformal deposition process. The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be used.

An optional first semiconductor channel layer 601 can be deposited directly on the tunneling dielectric layer 56. The first semiconductor channel layer 601 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 includes amorphous silicon or polysilicon. The first semiconductor channel layer 601 can be formed by a conformal deposition method such as low pressure chemical vapor deposition (LPCVD). The thickness of the first semiconductor channel layer 601 can be in a range from 2 nm to 10 nm, although lesser and greater thicknesses can also be used. A memory cavity 49' is formed in the volume of each memory opening 49 that is not filled with the deposited material layers (52, 54, 56, 601).

Referring to FIG. 5F, the optional first semiconductor channel layer 601, the tunneling dielectric layer 56, the charge storage layer 54, the blocking dielectric layer 52 are sequentially anisotropically etched using at least one anisotropic etch process. The portions of the first semiconductor channel layer 601, the tunneling dielectric layer 56, the charge storage layer 54, and the blocking dielectric layer 52 located above the top surface of the insulating cap layer 70 can be removed by the at least one anisotropic etch process. Further, the horizontal portions of the first semiconductor channel layer 601, the tunneling dielectric layer 56, the charge storage layer 54, and the blocking dielectric layer 52 at a bottom of each memory cavity 49' can be removed to form openings in remaining portions thereof. Each of the first semiconductor channel layer 601, the tunneling dielectric layer 56, the charge storage layer 54, and the blocking dielectric layer 52 can be etched by a respective anisotropic etch process using a respective etch chemistry, which may, or may not, be the same for the various material layers.

Each remaining portion of the first semiconductor channel layer 601 can have a tubular configuration. The charge storage layer 54 can comprise a charge trapping material or a floating gate material. In one embodiment, each charge storage layer 54 can include a vertical stack of charge storage regions that store electrical charges upon programming. In one embodiment, the charge storage layer 54 can be a silicon nitride layer in which each portion adjacent to the sacrificial material layers 42 constitutes a charge storage region.

A surface of the pedestal channel portion 11 (or a surface of the semiconductor material layer 10 in case the pedestal channel portions 11 are not used) can be physically exposed underneath the opening through the first semiconductor channel layer 601, the tunneling dielectric layer 56, the charge storage layer 54, and the blocking dielectric layer 52. Optionally, the physically exposed semiconductor surface at the bottom of each memory cavity 49' can be vertically recessed so that the recessed semiconductor surface underneath the memory cavity 49' is vertically offset from the topmost surface of the pedestal channel portion 11 (or of the semiconductor material layer 10 in case pedestal channel portions 11 are not used) by a recess distance. A tunneling dielectric layer 56 is located over the charge storage layer 54. A set of a blocking dielectric layer 52, a charge storage layer 54, and a tunneling dielectric layer 56 in a memory opening 49 constitutes a memory film 50, which includes a plurality of charge storage regions (comprising the charge storage layer 54) that are insulated from surrounding materials by the blocking dielectric layer 52 and the tunneling dielectric layer 56. In one embodiment, the first semiconductor channel layer 601, the tunneling dielectric layer 56, the charge storage layer 54, and the blocking dielectric layer 52 can have vertically coincident sidewalls.

A memory film 50 is formed within each memory opening 49 in the processing steps of FIGS. 5C and 5D. Each memory film 50 comprises a blocking dielectric layer 52 that laterally surrounds a silicon nitride layer 542. The blocking dielectric layer 52 is laterally surrounded by the alternating stack (32, 42). In one embodiment, the blocking dielectric layer 52 comprises a silicon oxide layer. Each memory film 50 can comprise a backside silicon carbon nitride interfacial layer 541 contacting an inner sidewall of the blocking dielectric layer 52. A silicon nitride layer 542 can be formed over a sidewall of a memory opening 49 directly on the backside silicon carbon nitride interfacial layer 541. Alternatively, the silicon nitride layer 542 can be formed over a sidewall of the memory opening 49 directly on an inner sidewall of the blocking dielectric layer 52. A tunneling dielectric layer 56 can be formed directly on the silicon carbon nitride interfacial layer 543. The tunneling dielectric layer 56 can comprise an ONO stack including a first silicon oxide layer that is formed directly on the silicon carbon nitride interfacial layer 543, a silicon oxynitride layer, and a second silicon oxide layer.

Figure 5G:
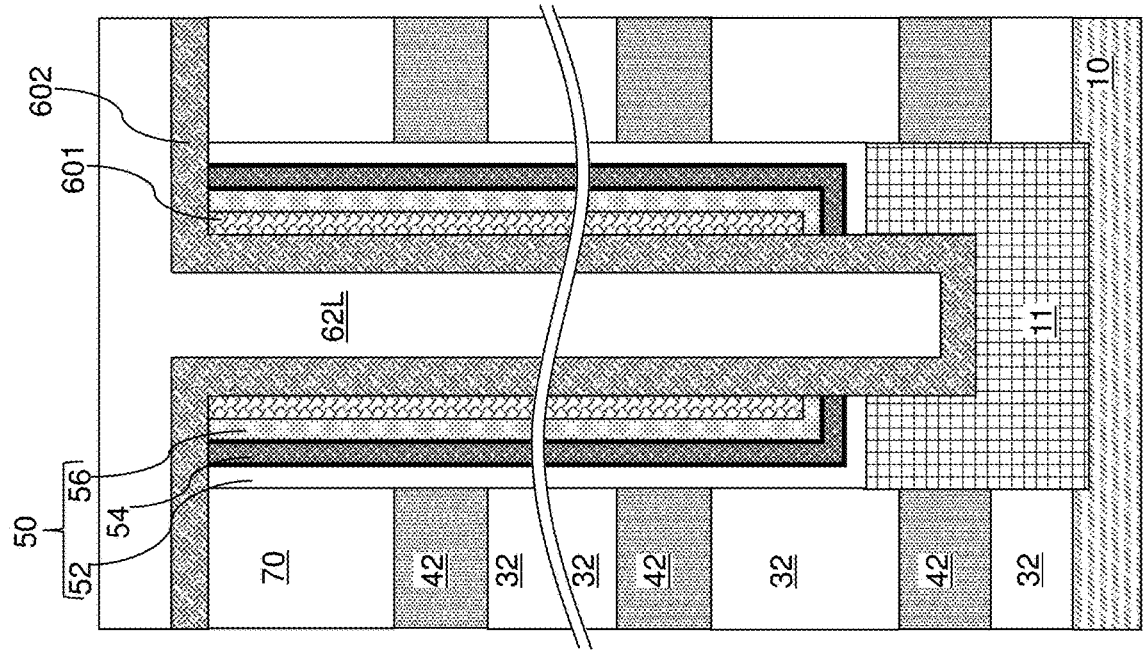

Referring to FIG. 5G, a second semiconductor channel layer 602 can be deposited directly on the semiconductor surface of the pedestal channel portion 11 or the semiconductor material layer 10 if the pedestal channel portion 11 is omitted, and directly on the first semiconductor channel layer 601. The second semiconductor channel layer 602 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602 includes amorphous silicon or polysilicon. The second semiconductor channel layer 602 can be formed by a conformal deposition method such as low pressure chemical vapor deposition (LPCVD). The thickness of the second semiconductor channel layer 602 can be in a range from 2 nm to 10 nm, although lesser and greater thicknesses can also be used. The second semiconductor channel layer 602 may partially fill the memory cavity 49' in each memory opening, or may fully fill the cavity in each memory opening.

The materials of the first semiconductor channel layer 601 and the second semiconductor channel layer 602 are collectively referred to as a semiconductor channel material. In other words, the semiconductor channel material is a set of all semiconductor material in the first semiconductor channel layer 601 and the second semiconductor channel layer 602.

Figure 5H:
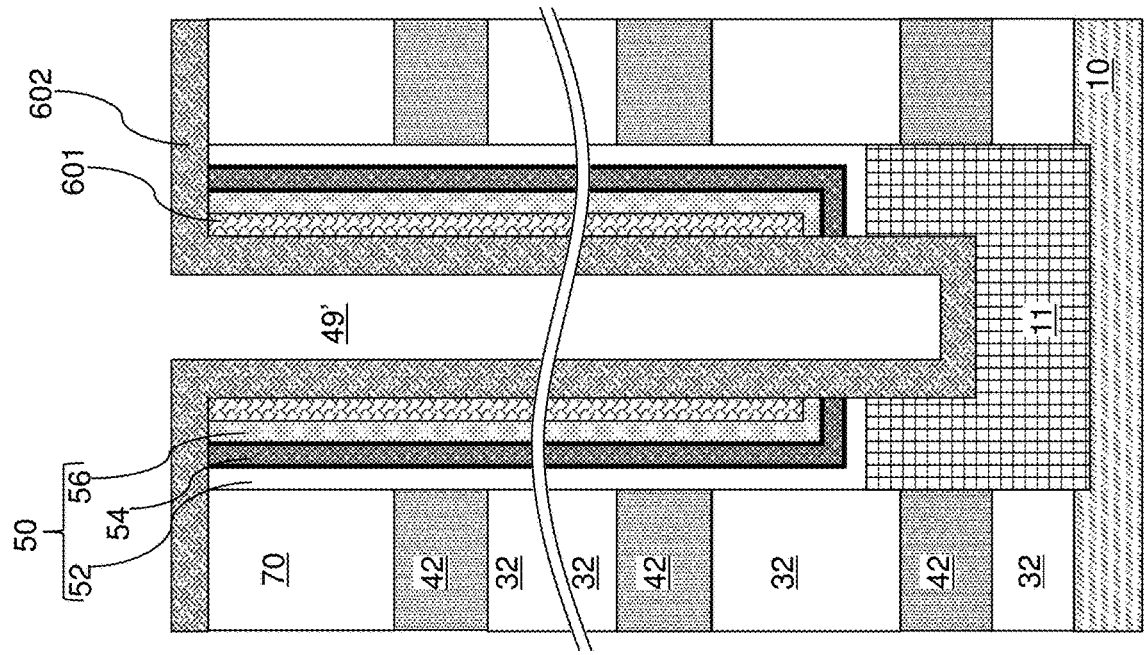

Referring to FIG. 5H, in case the memory cavity 49' in each memory opening is not completely filled by the second semiconductor channel layer 602, a dielectric core layer 62L can be deposited in the memory cavity 49' to fill any remaining portion of the memory cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Referring to FIG. 5I, the horizontal portion of the dielectric core layer 62L can be removed, for example, by a recess etch from above the top surface of the insulating cap layer 70. Each remaining portion of the dielectric core layer 62L constitutes a dielectric core 62. Further, the horizontal portion of the second semiconductor channel layer 602 located above the top surface of the insulating cap layer 70 can be removed by a planarization process, which can use a recess etch or chemical mechanical planarization (CMP). Each remaining portion of the second semiconductor channel layer 602 can be located entirety within a memory opening 49 or entirely within a support opening 19.

Each adjoining pair of a first semiconductor channel layer 601 and a second semiconductor channel layer 602 can collectively form a vertical semiconductor channel 60 through which electrical current can flow when a vertical NAND device including the vertical semiconductor channel 60 is turned on. A tunneling dielectric layer 56 is surrounded by a charge storage layer 54, and laterally surrounds a portion of the vertical semiconductor channel 60. Each adjoining set of a blocking dielectric layer 52, a charge storage layer 54, and a tunneling dielectric layer 56 collectively constitute a memory film 50, which can store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Referring to FIG. 5J, the top surface of each dielectric core 62 can be further recessed within each memory opening, for example, by a recess etch to a depth that is located between the top surface of the insulating cap layer 70 and the bottom surface of the insulating cap layer 70.

Drain regions 63 can be formed by depositing a doped semiconductor material within each recessed region above the dielectric cores 62. The drain regions 63 can have a doping of a second conductivity type that is the opposite of the first conductivity type. For example, if the first conductivity type is p-type, the second conductivity type is n-type, and vice versa. The dopant concentration in the drain regions 63 can be in a range from $5.0 \times 10^{19}/cm^3$ to $2.0 \times 10^{21}/cm^3$, although lesser and greater dopant concentrations can also be used. The doped semiconductor material can be, for example, doped polysilicon. Excess portions of the deposited semiconductor material can be removed from above the top surface of the insulating cap layer 70, for example, by chemical mechanical planarization (CMP) or a recess etch to form the drain regions 63.

Each combination of a memory film 50 and a vertical semiconductor channel 60 within a memory opening 49 constitutes a memory stack structure 55. The memory stack structure 55 is a combination of a semiconductor channel, a tunneling dielectric layer, a plurality of memory elements comprising portions of the charge storage layer 54, and an optional blocking dielectric layer 52. Each combination of a pedestal channel portion 11 (if present), a memory stack structure 55, a dielectric core 62, and a drain region 63 within a memory opening 49 is herein referred to as a memory opening fill structure (11, 55, 62, 63). Each combination of a pedestal channel portion 11 (if present), a memory film 50, a vertical semiconductor channel 60, a dielectric core 62, and a drain region 63 within each support opening 19 fills the respective support openings 19, and constitutes a support pillar structure.

Figure 6:
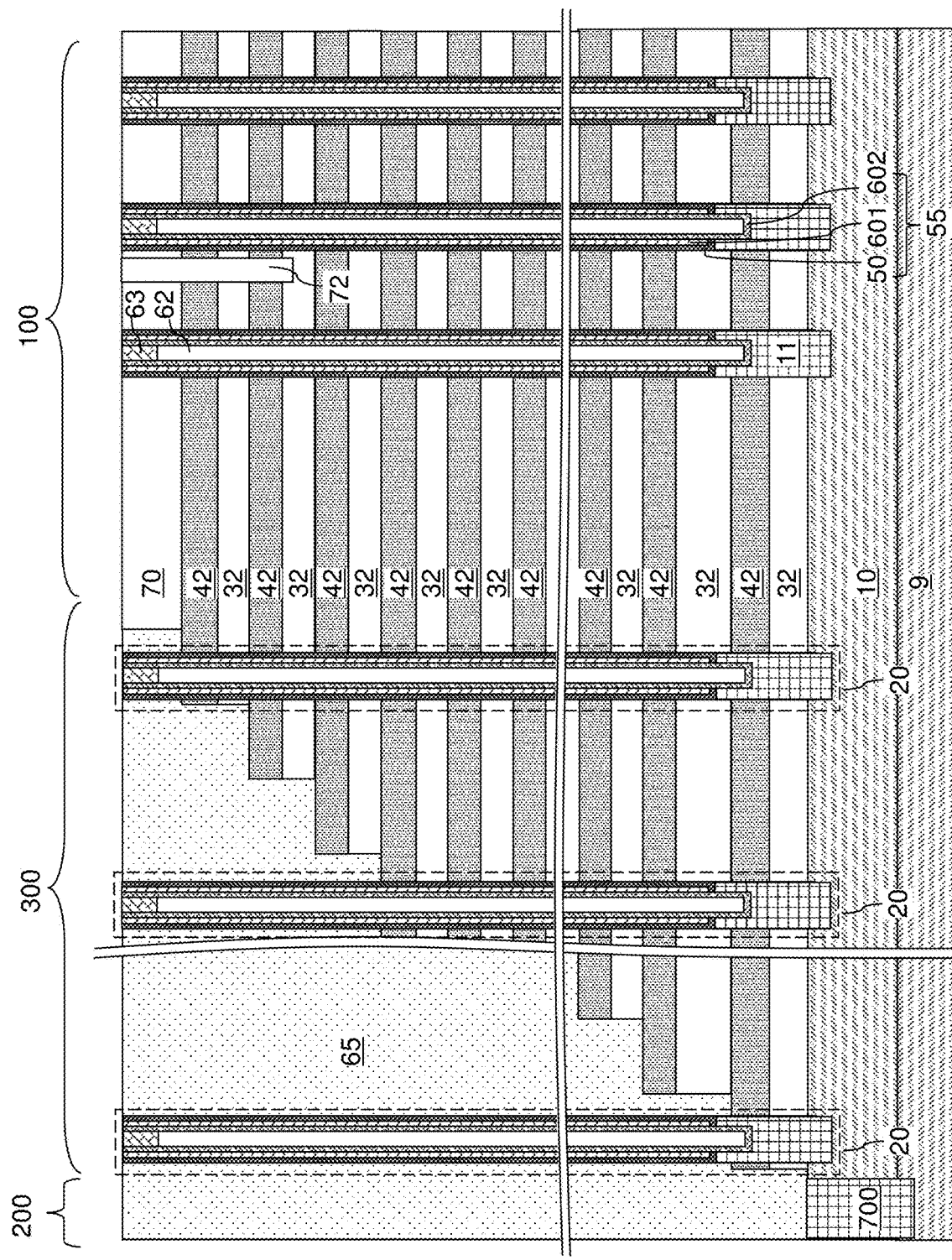
FIG. 6 is a schematic vertical cross-sectional view of the exemplary structure after formation of memory stack structures and support pillar structures according to an embodiment of the present disclosure.

Referring to FIG. 6, the exemplary structure is illustrated after formation of memory opening fill structures (11, 55, 62, 63) and support pillar structure 20 within the memory openings 49 and the support openings 19, respectively. An instance of a memory opening fill structure (11, 55, 62, 63) can be formed within each memory opening 49 of the structure of FIGS. 4A and 4B. An instance of the support pillar structure 20 can be formed within each support opening 19 of the structure of FIGS. 4A and 4B.

Each memory stack structure 55 includes a vertical semiconductor channel 60, which may comprise multiple semiconductor channel layers (601, 602), and a memory film 50. The memory film 50 may comprise a tunneling dielectric layer 56 laterally surrounding the vertical semiconductor channel 60, a vertical stack of charge storage regions (comprising a charge storage layer 54) laterally surrounding the tunneling dielectric layer 56, and an optional blocking dielectric layer 52.

Figure 7A:
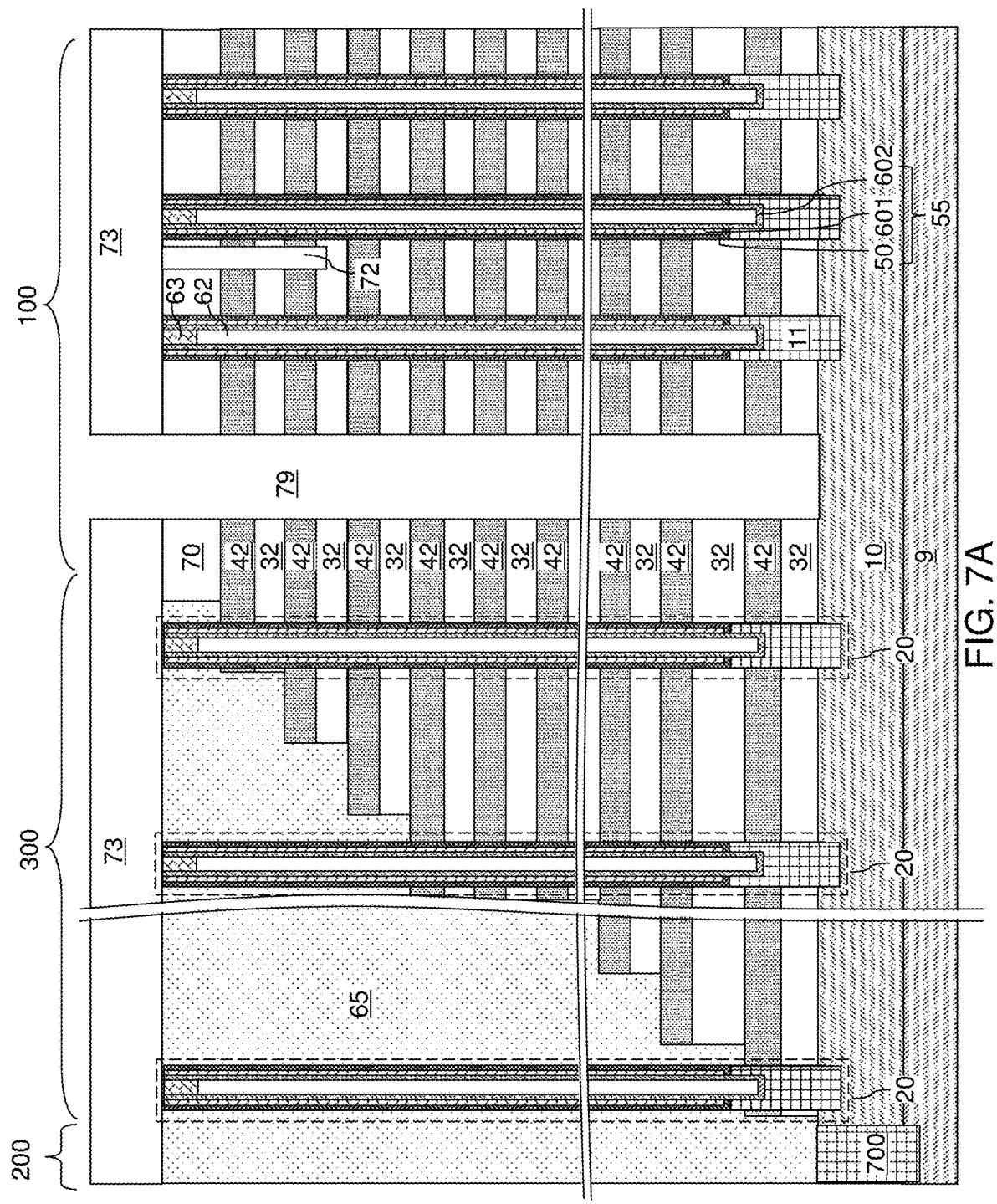
FIG. 7A is a schematic vertical cross-sectional view of the exemplary structure after formation of backside trenches according to an embodiment of the present disclosure.
Figure 7B:
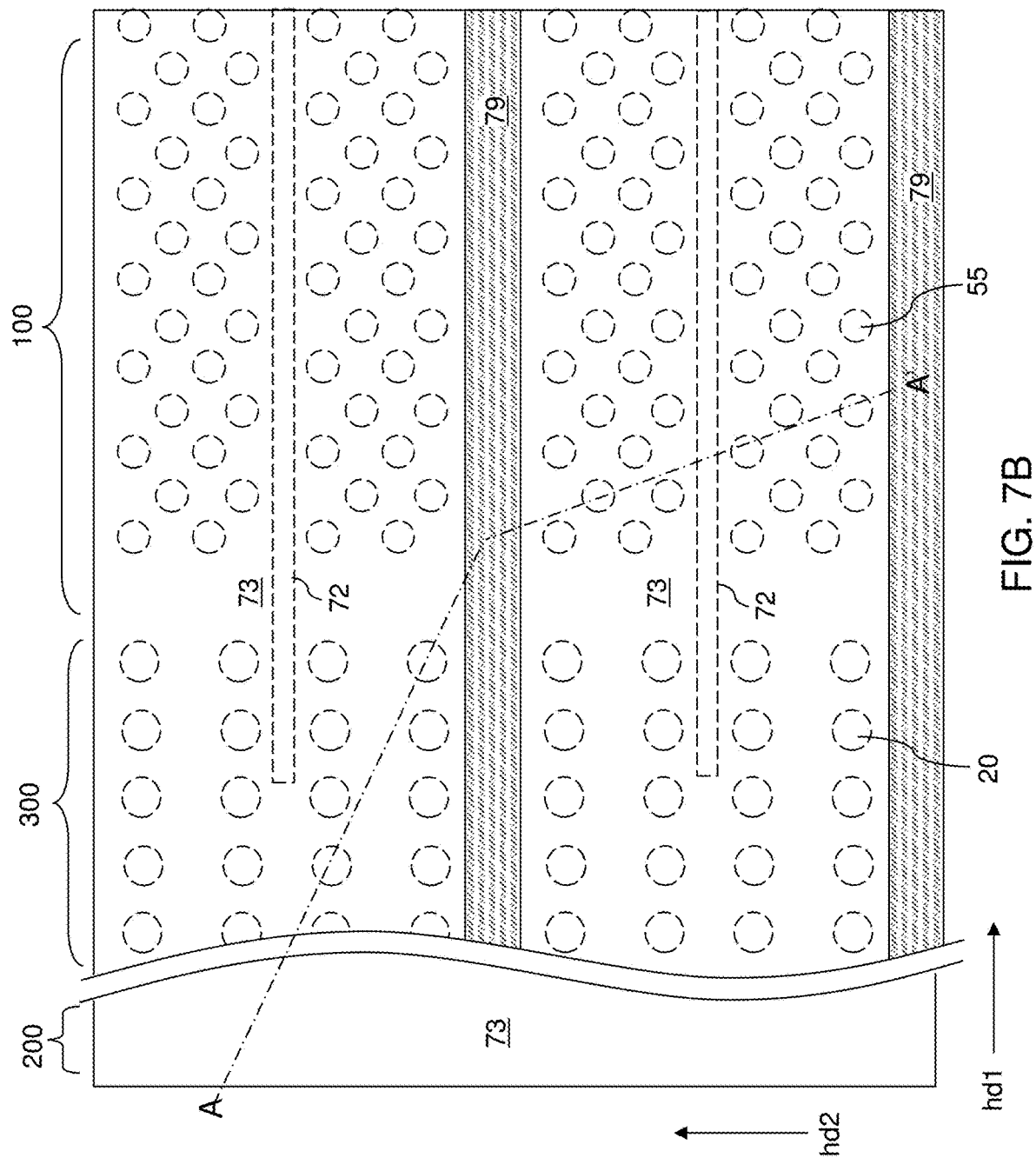
FIG. 7B is a partial see-through top-down view of the exemplary structure of FIG. 7A. The vertical plane A-A' is the plane of the schematic vertical cross-sectional view of FIG. 7A.

Referring to FIGS. 7A and 7B, a contact level dielectric layer 73 can be formed over the alternating stack (32, 42) of insulating layer 32 and sacrificial material layers 42, and over the memory stack structures 55 and the support pillar structures 20. The contact level dielectric layer 73 includes a dielectric material that is different from the dielectric material of the sacrificial material layers 42. For example, the contact level dielectric layer 73 can include silicon oxide. The contact level dielectric layer 73 can have a thickness in a range from 50 nm to 500 nm, although lesser and greater thicknesses can also be used.

A photoresist layer (not shown) can be applied over the contact level dielectric layer 73, and is lithographically patterned to form openings in areas between clusters of memory stack structures 55. The pattern in the photoresist layer can be transferred through the contact level dielectric layer 73, the alternating stack (32, 42) and/or the retro-stepped dielectric material portion 65 using an anisotropic etch to form backside trenches 79, which vertically extend from the top surface of the contact level dielectric layer 73 at least to the top surface of the substrate (9, 10), and laterally extend through the memory array region 100 and the contact region 300.

In one embodiment, the backside trenches 79 can laterally extend along a first horizontal direction hd1 and can be laterally spaced apart one from another along a second horizontal direction hd2 that is perpendicular to the first horizontal direction hd1. The memory stack structures 55 can be arranged in rows that extend along the first horizontal direction hd1. The drain select level isolation structures 72 can laterally extend along the first horizontal direction hd1. Each backside trench 79 can have a uniform width that is invariant along the lengthwise direction (i.e., along the first horizontal direction hd1). Each drain select level isolation structure 72 can have a uniform vertical cross-sectional profile along vertical planes that are perpendicular to the first horizontal direction hd1 that is invariant with translation along the first horizontal direction hd1. Multiple rows of memory stack structures 55 can be located between a neighboring pair of a backside trench 79 and a drain select level isolation structure 72, or between a neighboring pair of drain select level isolation structures 72. In one embodiment, the backside trenches 79 can include a source contact opening in which a source contact via structure can be subsequently formed. The photoresist layer can be removed, for example, by ashing.

Figure 8:
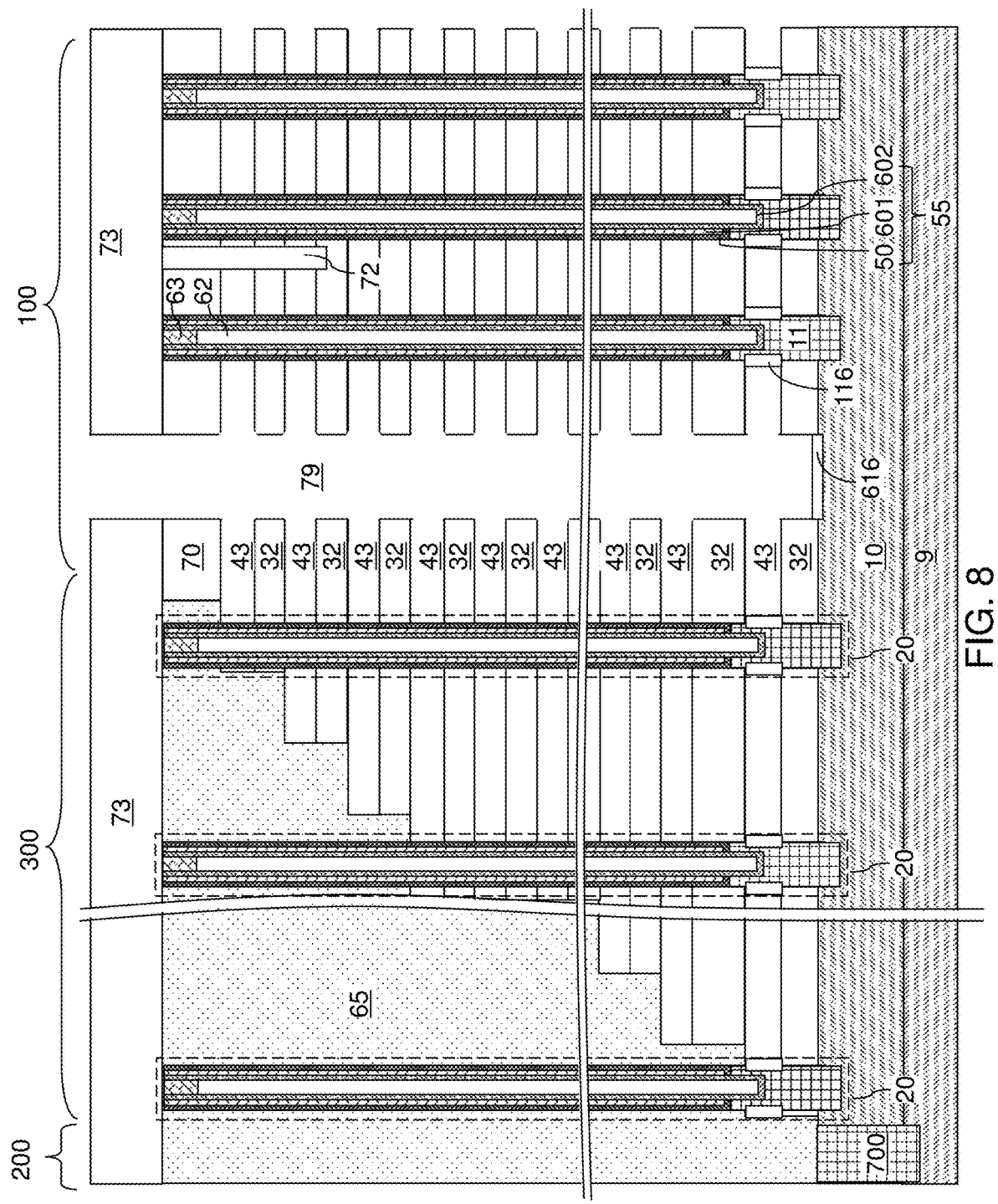
FIG. 8 is a schematic vertical cross-sectional view of the exemplary structure after formation of backside recesses according to an embodiment of the present disclosure.

Referring to FIGS. 8 and 9A, an etchant that selectively etches the second material of the sacrificial material layers 42 with respect to the first material of the insulating layers 32 can be introduced into the backside trenches 79, for example, using an etch process. FIG. 9A illustrates a region of the exemplary structure of FIG. 8. Backside recesses 43 are formed in volumes from which the sacrificial material layers 42 are removed. The removal of the second material of the sacrificial material layers 42 can be selective to the first material of the insulating layers 32, the material of the retro-stepped dielectric material portion 65, the semiconductor material of the semiconductor material layer 10, and the material of the outermost layer of the memory films 50. In one embodiment, the sacrificial material layers 42 can include silicon nitride, and the materials of the insulating layers 32 and the retro-stepped dielectric material portion 65 can be selected from silicon oxide and dielectric metal oxides.

The etch process that removes the second material selective to the first material and the outermost layer of the memory films 50 can be a wet etch process using a wet etch solution, or can be a gas phase (dry) etch process in which the etchant is introduced in a vapor phase into the backside trenches 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials used in the art. The support pillar structure 20, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout.

Physically exposed surface portions of the optional pedestal channel portions 11 and the semiconductor material layer 10 can be converted into dielectric material portions by thermal conversion and/or plasma conversion of the semiconductor materials into dielectric materials. For example, thermal conversion and/or plasma conversion can be used to convert a surface portion of each pedestal channel portion 11 into a tubular dielectric spacer 116, and to convert each physically exposed surface portion of the semiconductor material layer 10 into a planar dielectric portion 616. In one embodiment, each tubular dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The tubular dielectric spacers 116 include a dielectric material that includes the same semiconductor element as the pedestal channel portions 11 and additionally includes at least one non-metallic element such as oxygen and/or nitrogen such that the material of the tubular dielectric spacers 116 is a dielectric material. In one embodiment, the tubular dielectric spacers 116 can include a dielectric oxide, a dielectric nitride, or a dielectric oxynitride of the semiconductor material of the pedestal channel portions 11. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 can include a dielectric oxide, a dielectric nitride, or a dielectric oxynitride of the semiconductor material of the semiconductor material layer 10.

Referring to FIG. 9B, a backside blocking dielectric layer 44 can be optionally formed. The backside blocking dielectric layer 44, if present, comprises a dielectric material that functions as a control gate dielectric for the control gates to be subsequently formed in the backside recesses 43. In case the blocking dielectric layer 52 is present within each memory opening, the backside blocking dielectric layer 44 is optional. In case the blocking dielectric layer 52 is omitted, the backside blocking dielectric layer 44 is present.

The backside blocking dielectric layer 44 can be formed in the backside recesses 43 and on a sidewall of the backside trench 79. The backside blocking dielectric layer 44 can be formed directly on horizontal surfaces of the insulating layers 32 and sidewalls of the memory stack structures 55 within the backside recesses 43. If the backside blocking dielectric layer 44 is formed, formation of the tubular dielectric spacers 116 and the planar dielectric portion 616 prior to formation of the backside blocking dielectric layer 44 is optional. In one embodiment, the backside blocking dielectric layer 44 can be formed by a conformal deposition process such as atomic layer deposition (ALD). The backside blocking dielectric layer 44 can consist essentially of aluminum oxide. The thickness of the backside blocking dielectric layer 44 can be in a range from 1 nm to 15 nm, such as 2 to 6 nm, although lesser and greater thicknesses can also be used.

The dielectric material of the backside blocking dielectric layer 44 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer 44 can include a silicon oxide layer. The backside blocking dielectric layer 44 can be deposited by a conformal deposition method such as chemical vapor deposition or atomic layer deposition. The backside blocking dielectric layer 44 is formed on the sidewalls of the backside trenches 79, horizontal surfaces and sidewalls of the insulating layers 32, the portions of the sidewall surfaces of the memory stack structures 55 that are physically exposed to the backside recesses 43, and a top surface of the planar dielectric portion 616. A backside cavity 79' is present within the portion of each backside trench 79 that is not filled with the backside blocking dielectric layer 44.

Referring to FIG. 9C, a metallic barrier layer 46A can be deposited in the backside recesses 43. The metallic barrier layer 46A includes an electrically conductive metallic material that can function as a diffusion barrier layer and/or adhesion promotion layer for a metallic fill material to be subsequently deposited. The metallic barrier layer 46A can include a conductive metallic nitride material such as TiN, TaN, WN, or a stack thereof, or can include a conductive metallic carbide material such as TiC, TaC, WC, or a stack thereof. In one embodiment, the metallic barrier layer 46A can be deposited by a conformal deposition process such as chemical vapor deposition (CVD) or atomic layer deposition (ALD). The thickness of the metallic barrier layer 46A can be in a range from 2 nm to 8 nm, such as from 3 nm to 6 nm, although lesser and greater thicknesses can also be used. In one embodiment, the metallic barrier layer 46A can consist essentially of a conductive metal nitride such as TiN.

Figure 10:
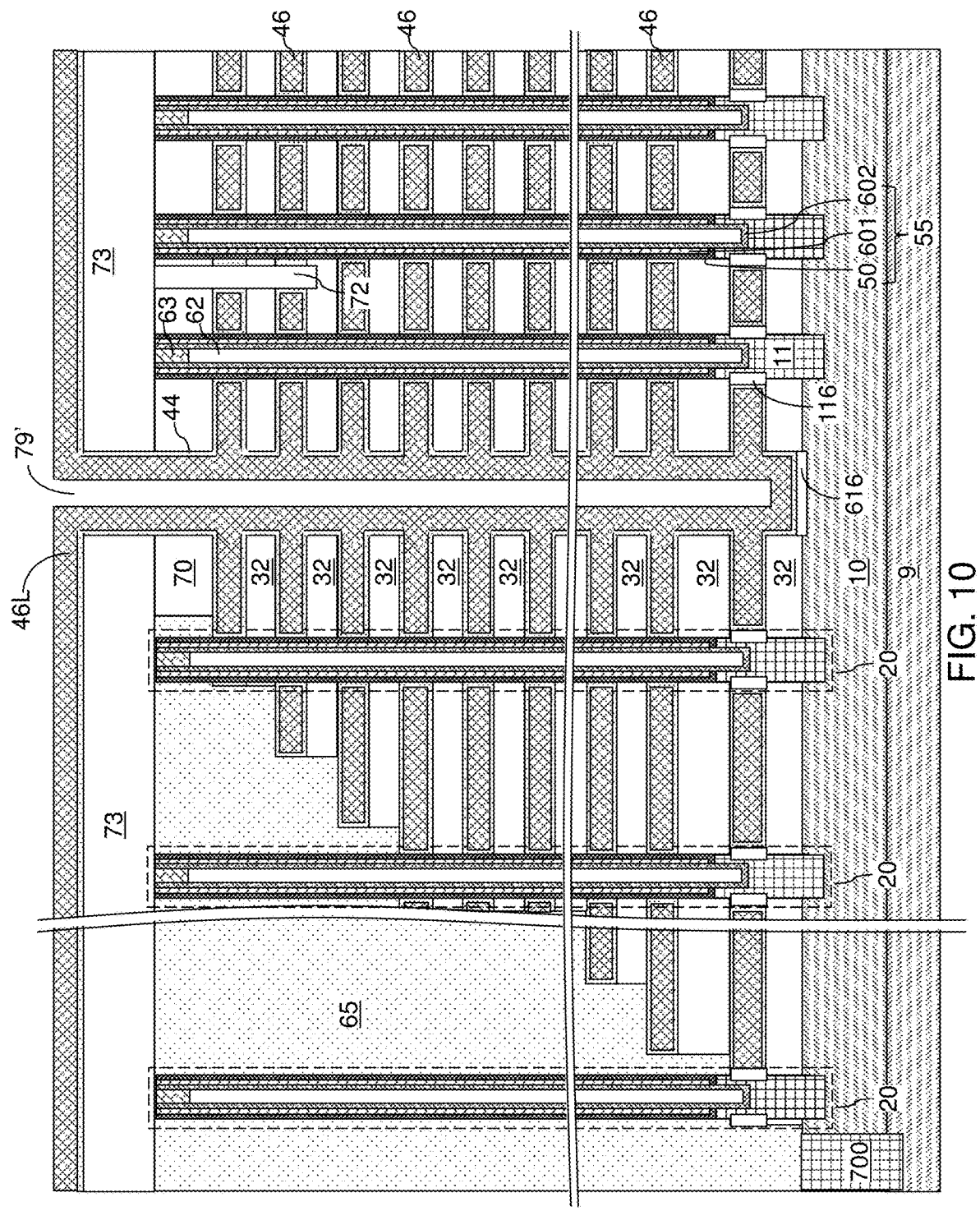
FIG. 10 is a schematic vertical cross-sectional view of the exemplary structure at the processing step of FIG. 9D.

Referring to FIGS. 9D and 10, a metal fill material is deposited in the plurality of backside recesses 43, on the sidewalls of the at least one the backside trench 79, and over the top surface of the contact level dielectric layer 73 to form a metallic fill material layer 46B. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer 46B can consist essentially of at least one elemental metal. The at least one elemental metal of the metallic fill material layer 46B can be selected, for example, from tungsten, cobalt, ruthenium, titanium, and tantalum. In one embodiment, the metallic fill material layer 46B can consist essentially of a single elemental metal. In one embodiment, the metallic fill material layer 46B can be deposited using a fluorine-containing precursor gas such as $WF_6$. In one embodiment, the metallic fill material layer 46B can be a tungsten layer including a residual level of fluorine atoms as impurities. The metallic fill material layer 46B is spaced from the insulating layers 32 and the memory stack structures 55 by the metallic barrier layer 46A, which is a metallic barrier layer that blocks diffusion of fluorine atoms therethrough.

A plurality of electrically conductive layers 46 can be formed in the plurality of backside recesses 43, and a continuous metallic material layer 46L can be formed on the sidewalls of each backside trench 79 and over the contact level dielectric layer 73. Each electrically conductive layer 46 includes a portion of the metallic barrier layer 46A and a portion of the metallic fill material layer 46B that are located between a vertically neighboring pair of dielectric material layers such as a pair of insulating layers 32. The continuous metallic material layer 46L includes a continuous portion of the metallic barrier layer 46A and a continuous portion of the metallic fill material layer 46B that are located in the backside trenches 79 or above the contact level dielectric layer 73.

Each sacrificial material layer 42 can be replaced with an electrically conductive layer 46. A backside cavity 79' is present in the portion of each backside trench 79 that is not filled with the backside blocking dielectric layer 44 and the continuous metallic material layer 46L. A tubular dielectric spacer 116 laterally surrounds a pedestal channel portion 11. A bottommost electrically conductive layer 46 laterally surrounds each tubular dielectric spacer 116 upon formation of the electrically conductive layers 46.

Figure 11A:
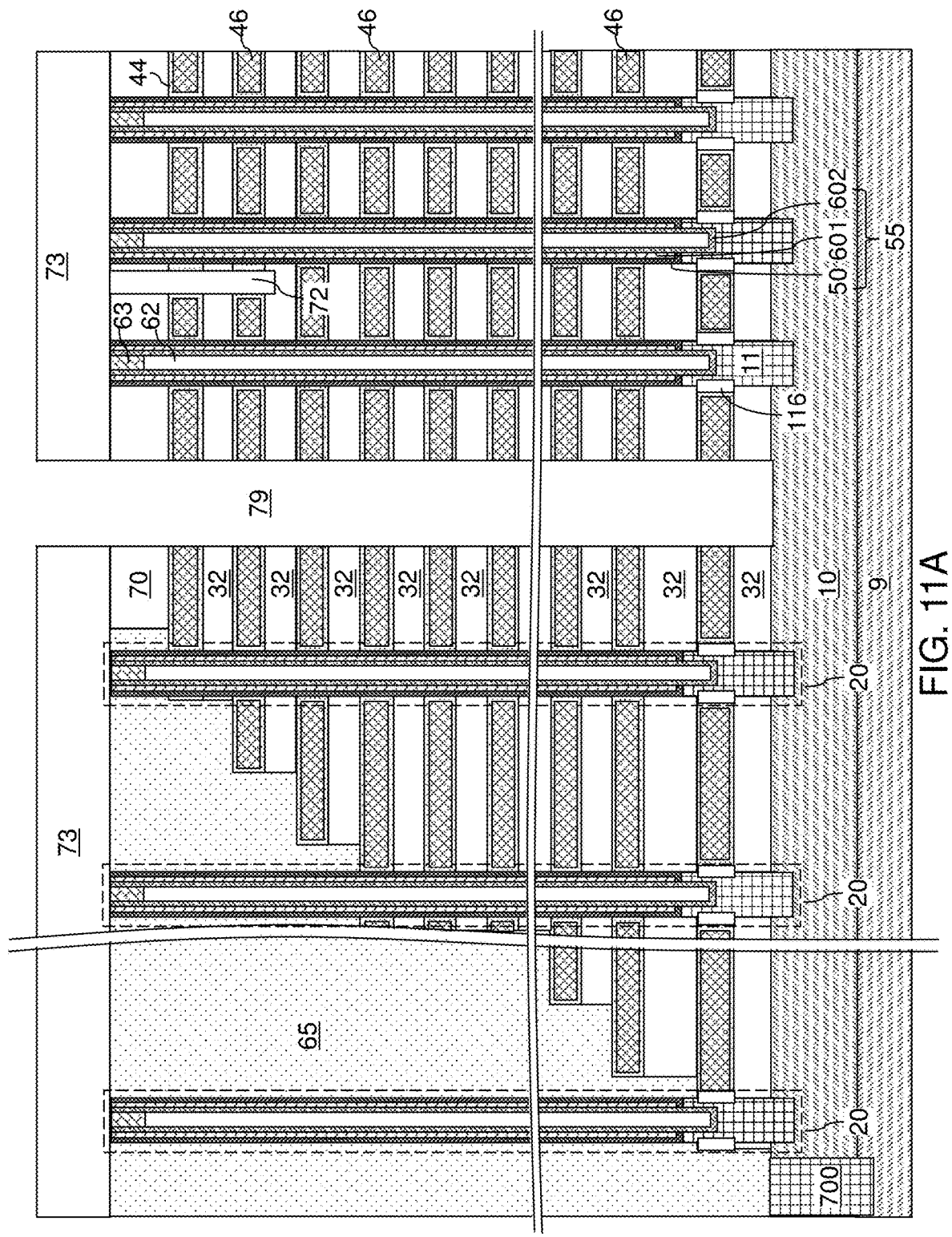
FIG. 11A is a schematic vertical cross-sectional view of the exemplary structure after removal of a deposited conductive material from within the backside trench according to an embodiment of the present disclosure.
Figure 11B:
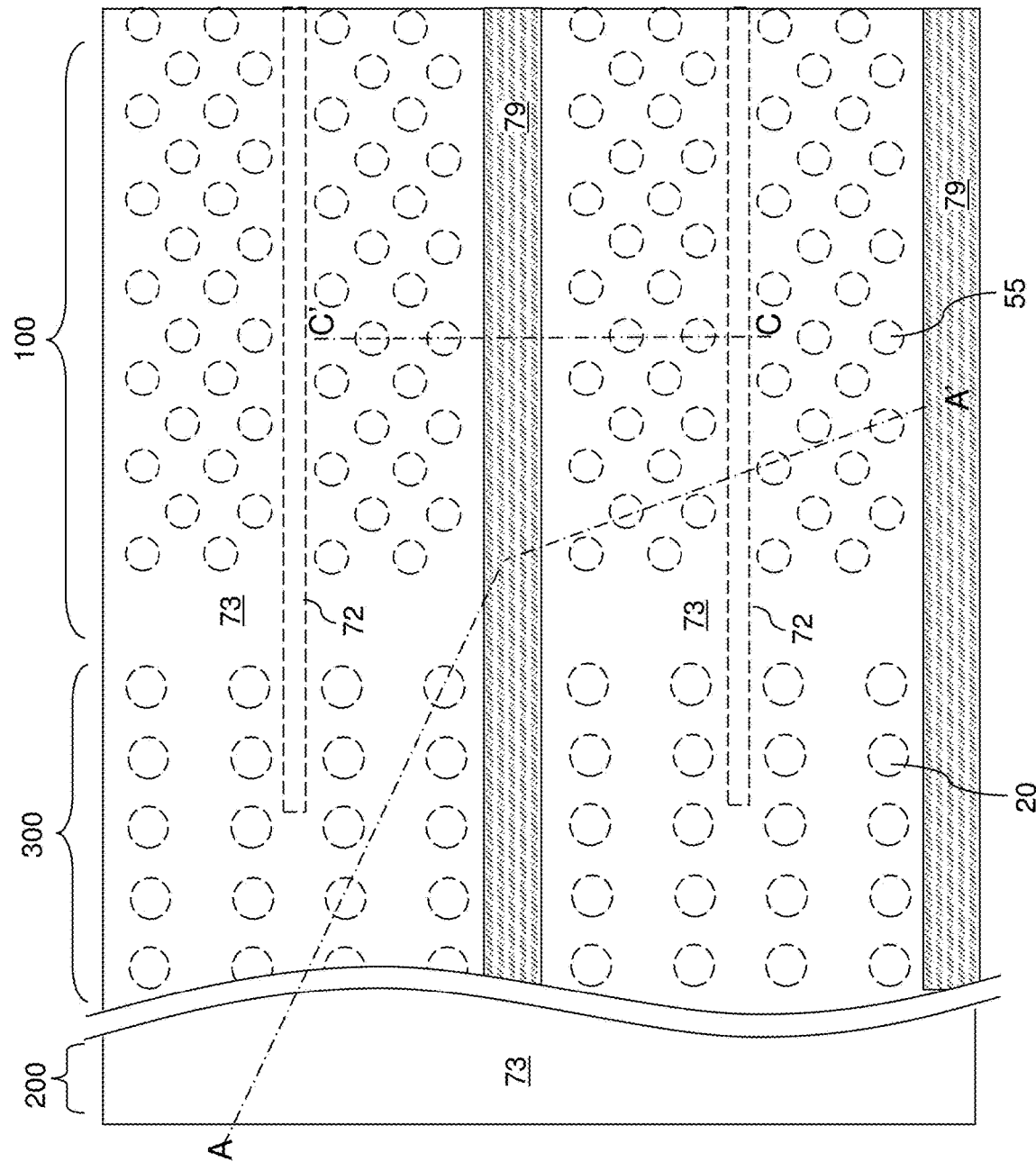
FIG. 11B is a partial see-through top-down view of the exemplary structure of FIG. 11A. The vertical plane A-A' is the plane of the schematic vertical cross-sectional view of FIG. 11A.
Figure 11C:
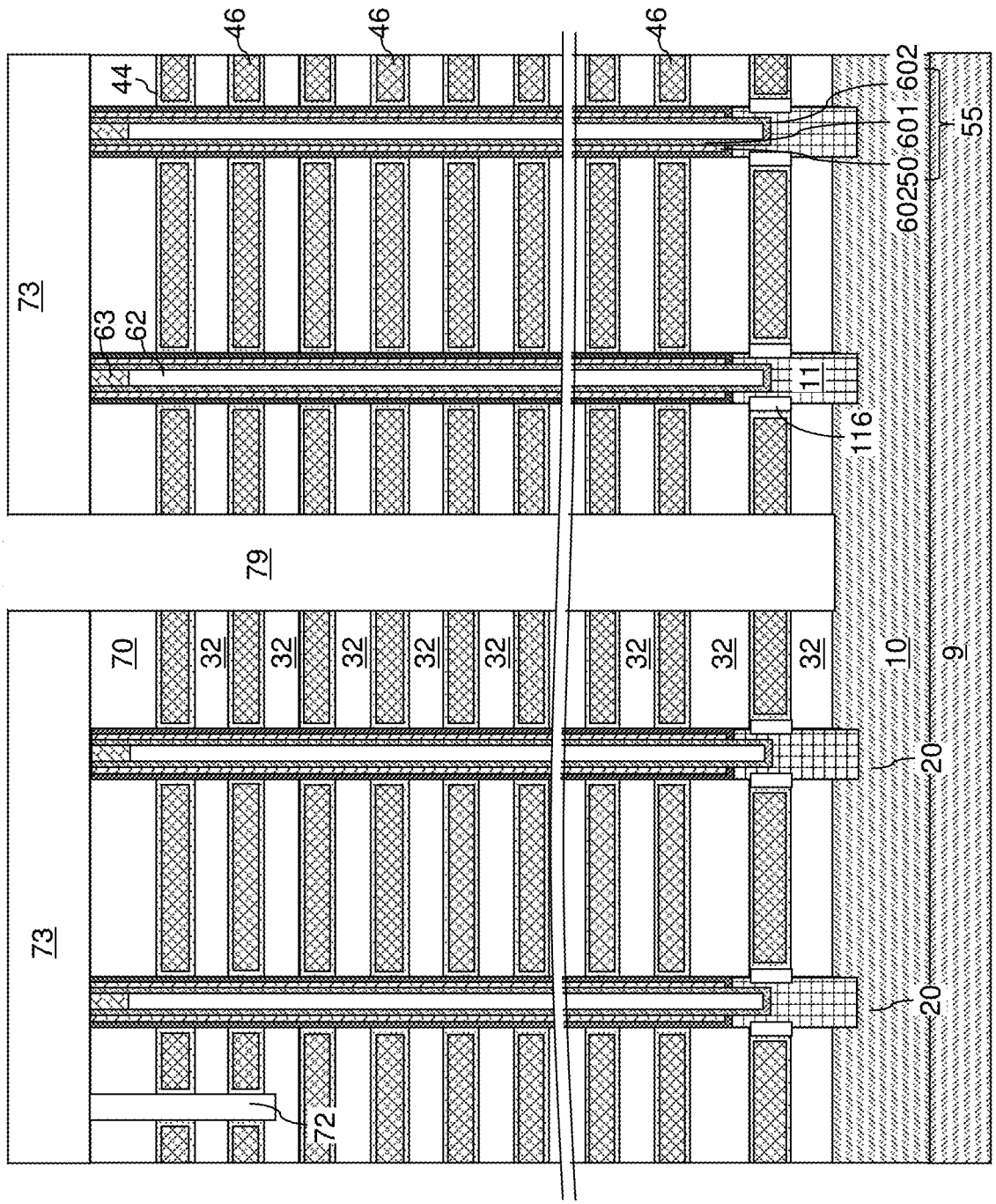
FIG. 11C is a vertical cross-sectional view of the exemplary structure along the vertical plane C-C' of FIG. 11B.

Referring to FIG. 11, the deposited metallic material of the continuous electrically conductive material layer 46L is etched back from the sidewalls of each backside trench 79 and from above the contact level dielectric layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically connecting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices.

In one embodiment, the removal of the continuous electrically conductive material layer 46L can be selective to the material of the backside blocking dielectric layer 44. In this case, a horizontal portion of the backside blocking dielectric layer 44 can be present at the bottom of each backside trench 79. In another embodiment, the removal of the continuous electrically conductive material layer 46L may not be selective to the material of the backside blocking dielectric layer 44 or, the backside blocking dielectric layer 44 may not be used. The planar dielectric portions 616 can be removed during removal of the continuous electrically conductive material layer 46L. A backside cavity 79' is present within each backside trench 79.

Figure 12A:
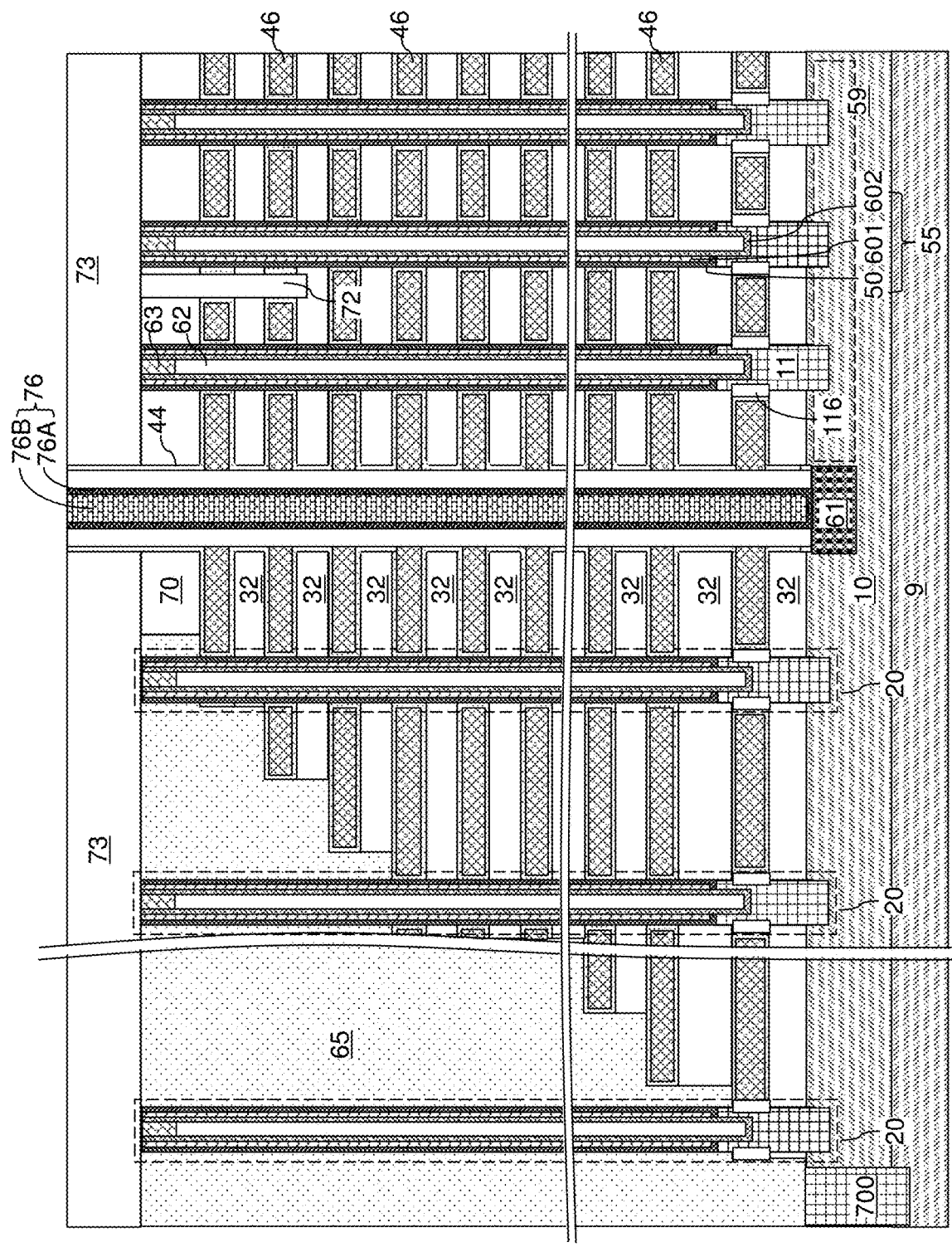
FIG. 12A is a schematic vertical cross-sectional view of the exemplary structure after formation of an insulating spacer and a backside contact structure according to an embodiment of the present disclosure.
Figure 12B:
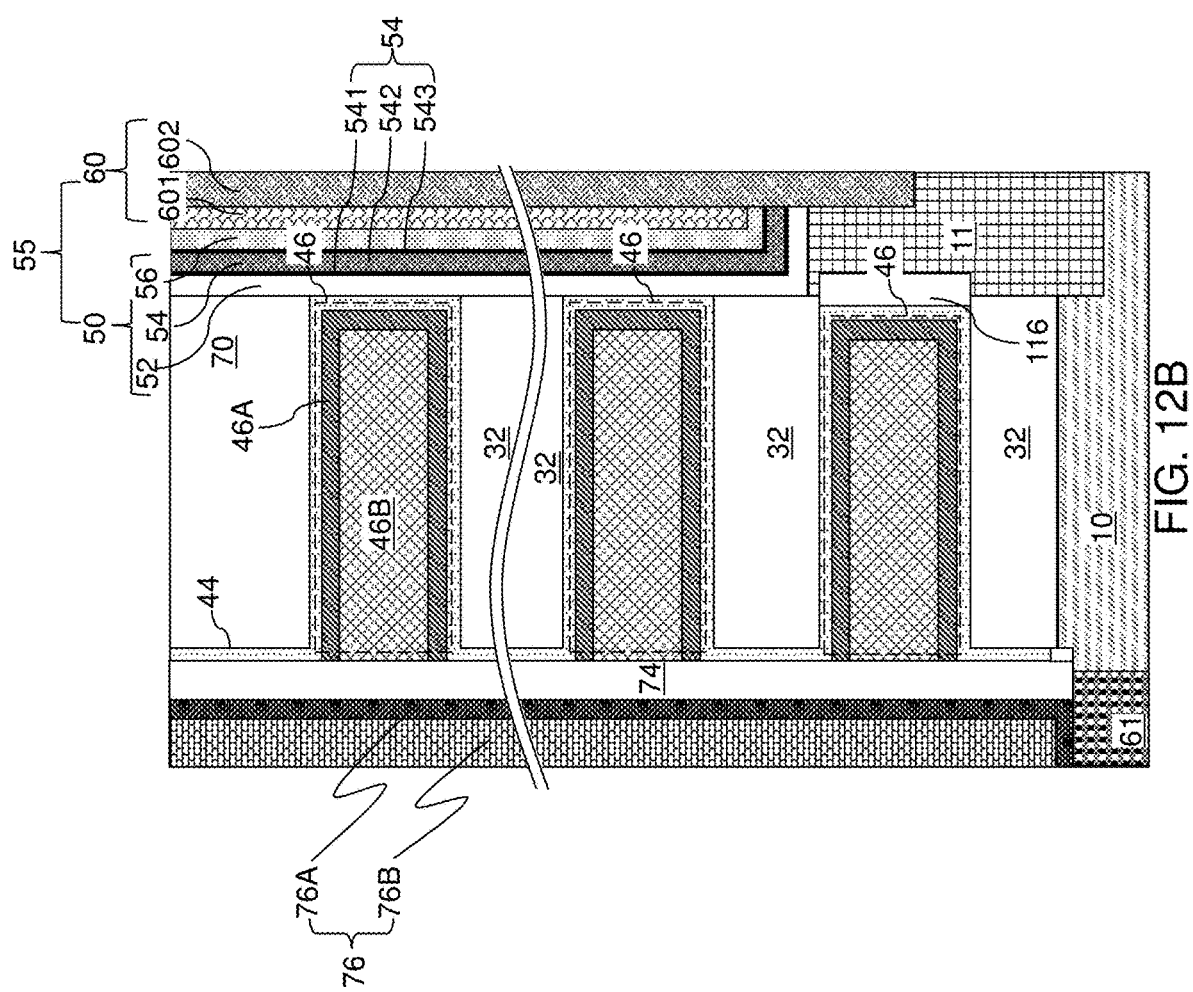
FIG. 12B is a magnified view of a region of a first configuration of the exemplary structure of FIG. 12A.
Figure 12C:
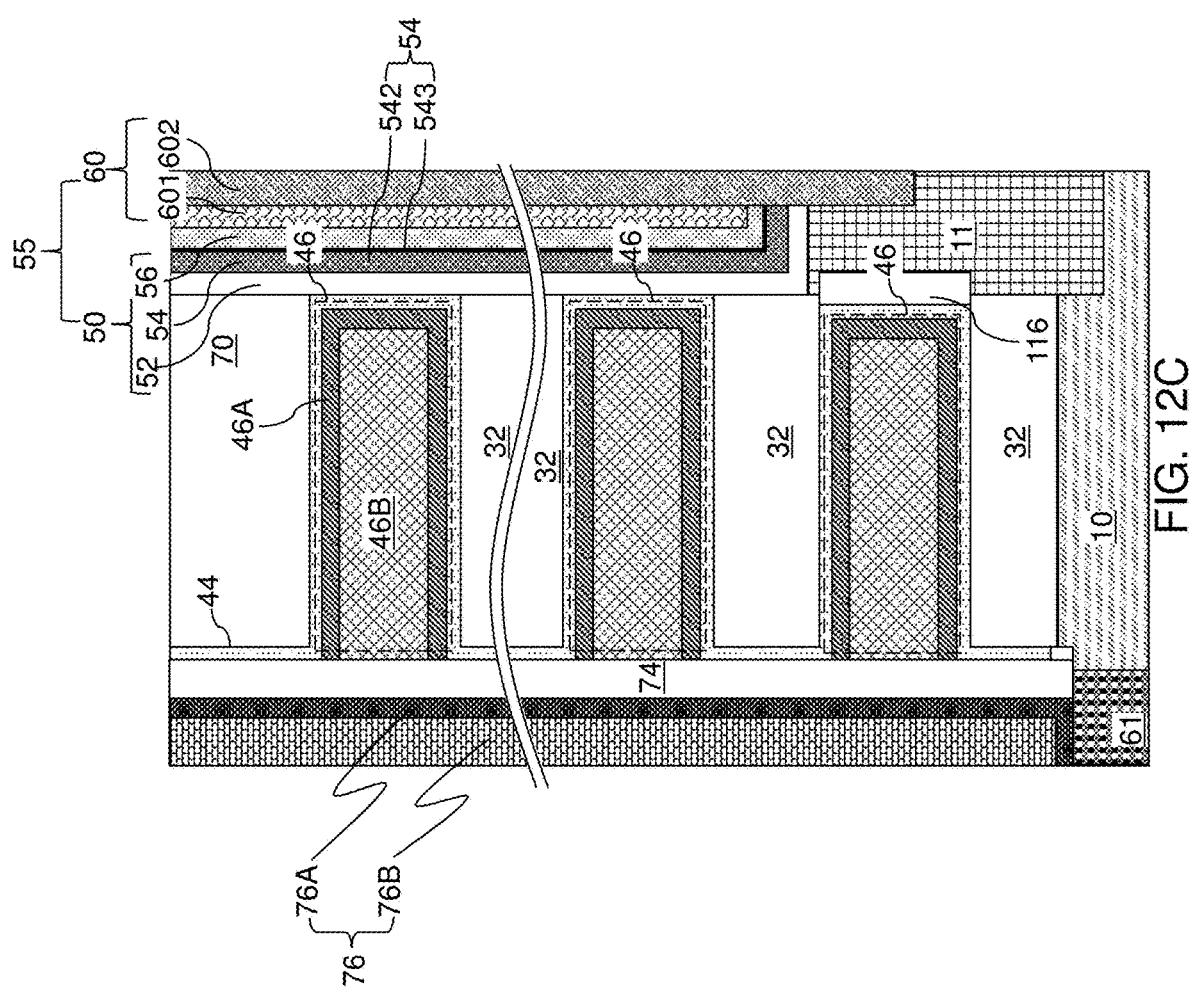
FIG. 12C is a magnified view of a region of a second configuration of the exemplary structure of FIG. 12A.

Referring to FIGS. 12A and 12B, an insulating material layer can be formed in the backside trenches 79 and over the contact level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be used.

If a backside blocking dielectric layer 44 is present, the insulating material layer can be formed directly on surfaces of the backside blocking dielectric layer 44 and directly on the sidewalls of the electrically conductive layers 46. If a backside blocking dielectric layer 44 is not used, the insulating material layer can be formed directly on sidewalls of the insulating layers 32 and directly on sidewalls of the electrically conductive layers 46.

An anisotropic etch is performed to remove horizontal portions of the insulating material layer from above the contact level dielectric layer 73 and at the bottom of each backside trench 79. Each remaining portion of the insulating material layer constitutes an insulating spacer 74. A backside cavity 79' is present within a volume surrounded by each insulating spacer 74. A top surface of the semiconductor material layer 10 can be physically exposed at the bottom of each backside trench 79.

A source region 61 can be formed at a surface portion of the semiconductor material layer 10 under each backside cavity 79' by implantation of electrical dopants into physically exposed surface portions of the semiconductor material layer 10. Each source region 61 is formed in a surface portion of the substrate (9, 10) that underlies a respective opening through the insulating spacer 74. Due to the straggle of the implanted dopant atoms during the implantation process and lateral diffusion of the implanted dopant atoms during a subsequent activation anneal process, each source region 61 can have a lateral extent greater than the lateral extent of the opening through the insulating spacer 74.

An upper portion of the semiconductor material layer 10 that extends between the source region 61 and the plurality of pedestal channel portions 11 constitutes a horizontal semiconductor channel 59 for a plurality of field effect transistors. The horizontal semiconductor channel 59 is connected to multiple vertical semiconductor channels 60 through respective pedestal channel portions 11. The horizontal semiconductor channel 59 contacts the source region 61 and the plurality of pedestal channel portions 11. A bottommost electrically conductive layer 46 provided upon formation of the electrically conductive layers 46 within the alternating stack (32, 46) can comprise a select gate electrode for the field effect transistors. Each source region 61 is formed in an upper portion of the semiconductor substrate (9, 10). Semiconductor channels (59, 11, 60) extend between each source region 61 and a respective set of drain regions 63. The semiconductor channels (59, 11, 60) include the vertical semiconductor channels 60 of the memory stack structures 55.

A backside contact via structure 76 can be formed within each backside cavity 79'. Each contact via structure 76 can fill a respective cavity 79'. The contact via structures 76 can be formed by depositing at least one conductive material in the remaining unfilled volume (i.e., the backside cavity 79') of the backside trench 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be used. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized using the contact level dielectric layer 73 overlying the alternating stack (32, 46) as a stopping layer. If chemical mechanical planarization (CMP) process is used, the contact level dielectric layer 73 can be used as a CMP stopping layer. Each remaining continuous portion of the at least one conductive material in the backside trenches 79 constitutes a backside contact via structure 76.

The backside contact via structure 76 extends through the alternating stack (32, 46), and contacts a top surface of the source region 61. If a backside blocking dielectric layer 44 is used, the backside contact via structure 76 can contact a sidewall of the backside blocking dielectric layer 44.

Figure 13A:
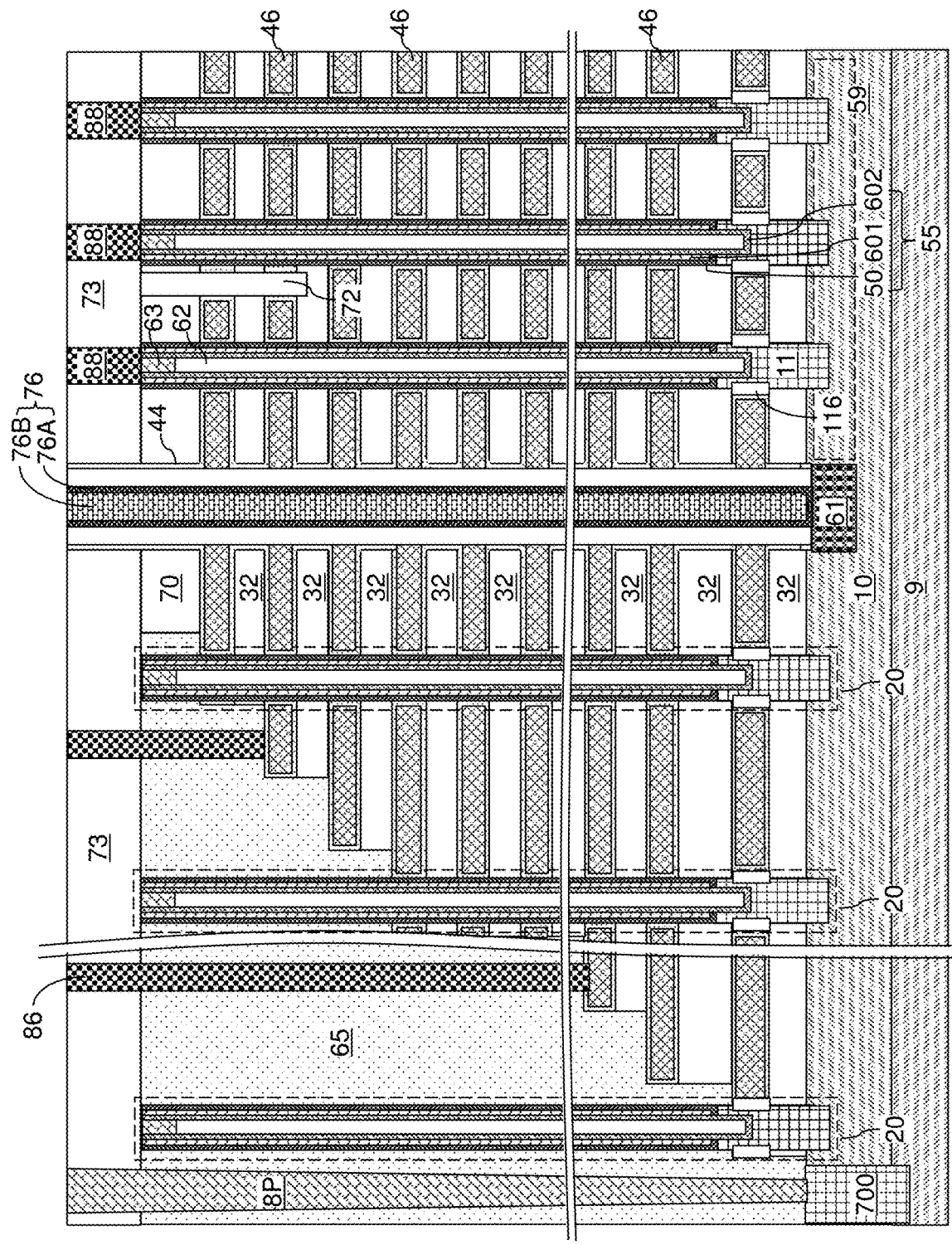
FIG. 13A is a schematic vertical cross-sectional view of the exemplary structure after formation of additional contact via structures according to an embodiment of the present disclosure.
Figure 13B:
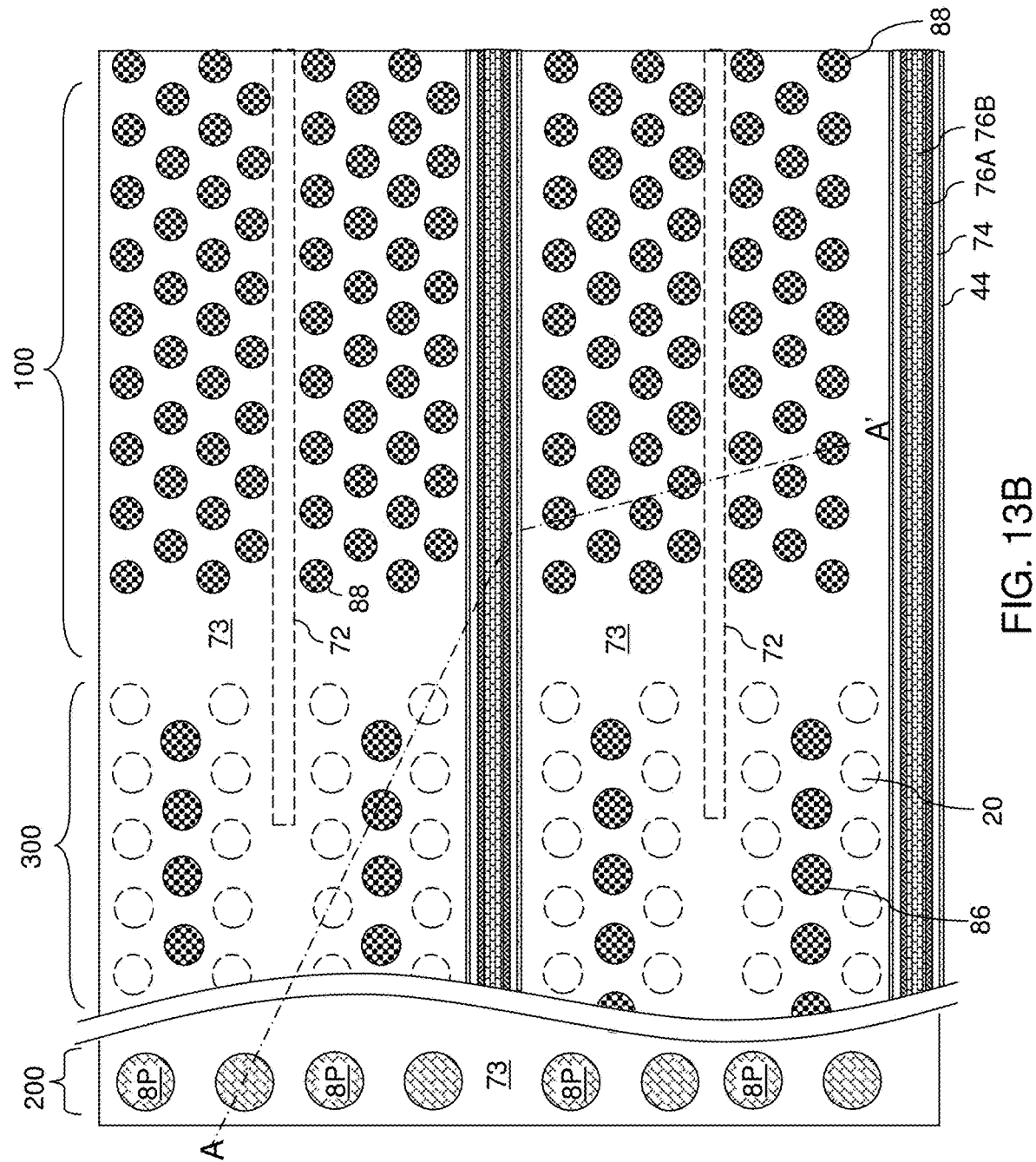
FIG. 13B is a top-down view of the exemplary structure of FIG. 13A. The vertical plane A-A' is the plane of the schematic vertical cross-sectional view of FIG. 13A.

Referring to FIGS. 13A and 13B, additional contact via structures (88, 86, 8P) can be formed through the contact level dielectric layer 73, and optionally through the retro-stepped dielectric material portion 65. For example, drain contact via structures 88 can be formed through the contact level dielectric layer 73 on each drain region 63. Word line contact via structures 86 can be formed on the electrically conductive layers 46 through the contact level dielectric layer 73, and through the retro-stepped dielectric material portion 65. Peripheral device contact via structures 8P can be formed through the retro-stepped dielectric material portion 65 directly on respective nodes of the peripheral devices.

Figure 14:
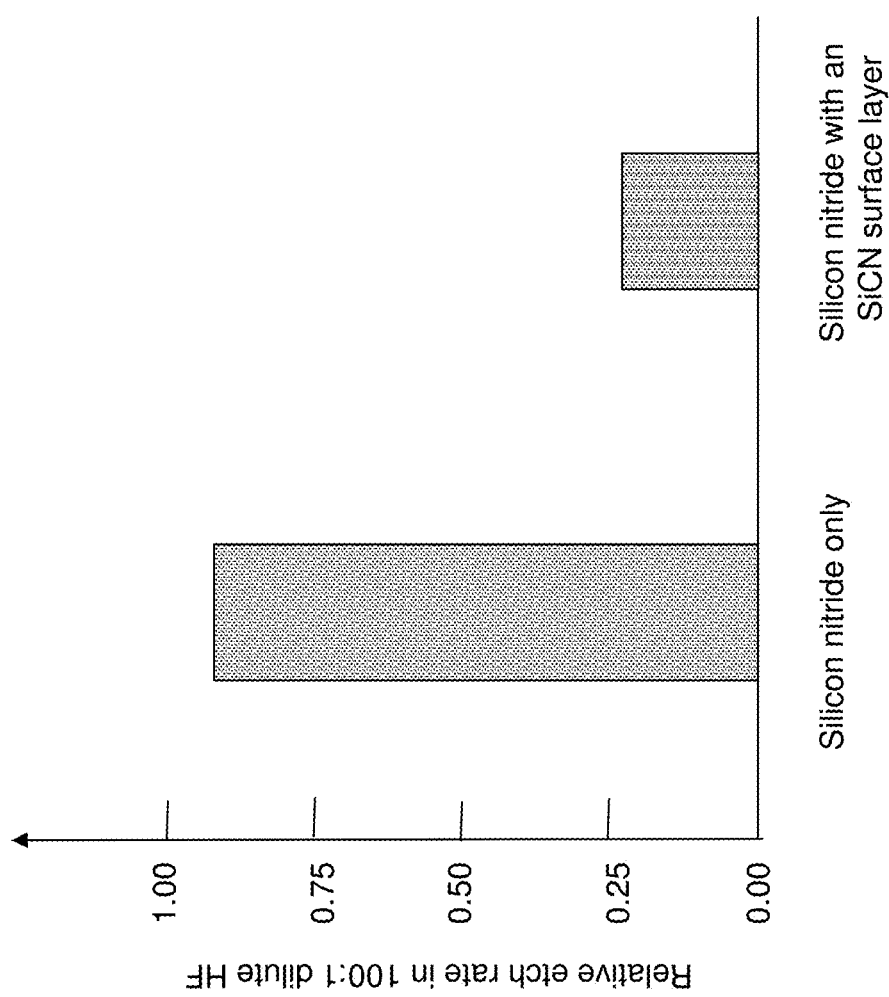
FIG. 14 shows relative etch rates in 100:1 dilute hydrofluoric acid for a silicon nitride film and a silicon nitride film with an SiCN interfacial layer.

Referring to FIG. 14, relative etch rates in 100:1 dilute hydrofluoric acid are shown for a silicon nitride film and for a silicon nitride film with an SiCN interfacial layer. The silicon nitride film was formed by a low pressure chemical vapor deposition process and consisted essentially of silicon nitride. The silicon nitride film with a SiCN interfacial layer was formed by a low pressure chemical vapor deposition process that deposited a silicon nitride film followed by a carbon adsorption process and a silicon adsorption process at an elevated temperature that formed a silicon carbon nitride interfacial layer 543 described above. For the duration of a wet etch process in which 100:1 dilute hydrofluoric acid etched about 0.9 nm of the silicon nitride film, the SiCN interfacial layer was etched only by about 0.23 nm in 100:1 dilute hydrofluoric acid. Thus, the SiCN interfacial layer is more resistant to the wet etch process using 100:1 dilute hydrofluoric acid, which is used to remove silicon oxide of a tunneling dielectric layer.

A cause for formation of a silicon nitride-silicon oxide mixing layer within a memory film is surface oxidation of a silicon nitride layer during deposition of a silicon oxide layer, such as a first silicon oxide layer in an ONO tunneling dielectric layer, and during post-deposition thermal processes. According to an aspect of the present disclosure, in-situ formation of an SiCN interfacial layer 543 on a silicon nitride layer 542 is used to reduce or prevent formation of a silicon nitride-silicon oxide mixing layer. The SiCN interfacial layer 543 suppresses etching of the silicon nitride material in the silicon nitride layer 542 in 100:1 dilute hydrofluoric acid, which is effective for etching silicon oxide. The relative etch rates illustrated in FIG. 14 demonstrates that the SiCN interfacial layer 543 is an effective barrier layer for oxygen atoms and reduces formation of a silicon nitride-silicon oxide mixing layer.

Figure 15:
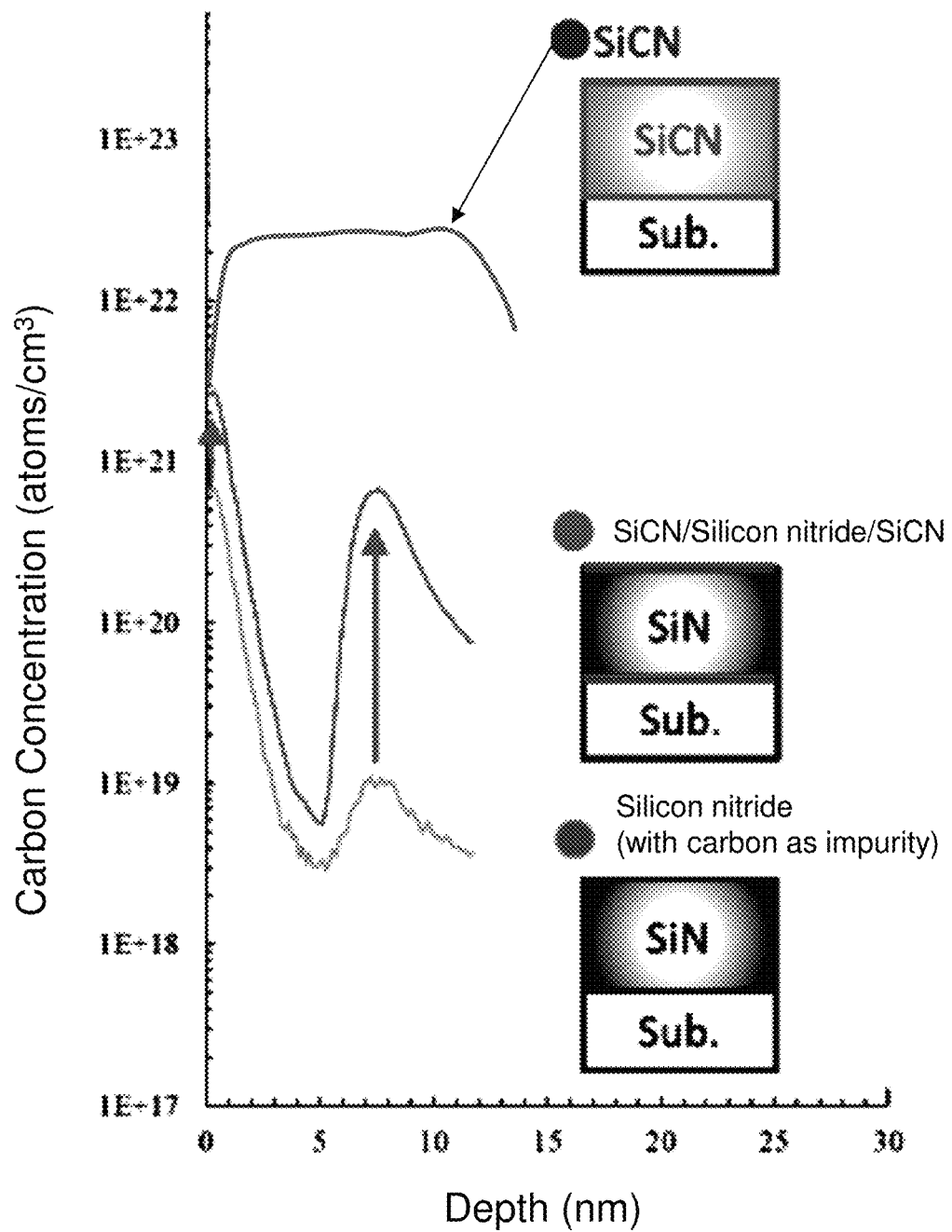
FIG. 15 shows second ion mass spectroscopy (SIMS) profiles for silicon nitride, a thin silico nitride film located between two SiCN interfacial layers, and an SiCN film.

FIG. 15 shows second ion mass spectroscopy (SIMS) profiles for a silicon nitride film including an impurity level carbon layer, a silicon nitride film located between two SiCN interfacial layers, and an SiCN film. The SiCN film includes carbon at a concentration of about $2 \times 10^{23}/cm^3$, which corresponds to about 40% in atomic concentration. The impurity level carbon layer within the silicon nitride film including an impurity level carbon layer shows a measured peak carbon density of about $1 \times 10^{19}/cm^3$, which would correspond to approximately $2 \times 10^{20}/cm^3$ because all measured carbon concentration in the SIMS profile is from the impurity level carbon layer confined within a thickness of a monolayer or two. The concentration of $2 \times 10^{20}/cm^3$ corresponds to an atomic concentration of about 0.4%, which is consistent with the nature of the "impurity level" carbon layer. The SiCN interfacial layer within the silicon nitride film located between two SiCN interfacial layers shows a measured peak carbon density of about $7 \times 10^{20}/cm^3$, which would correspond to approximately $1.4 \times 10^{22}/cm^3$ because all measured carbon concentration in the SIMS profile is from the SiCN interfacial layer having a thickness of approximately 0.5 nm. The concentration of $1.4 \times 10^{22}/cm^3$ corresponds to an atomic concentration of about 28%, which is significantly higher than an impurity level. Thus, the SiCN interfacial layer has a significantly higher concentration of carbon than any carbon impurity layer. The carbon concentration of a physically exposed SiCN interfacial layer is difficult to measure due to surface effects, which is evident in the artificial carbon peak in the silicon nitride film including the impurity level carbon layer. However, a significantly higher surface carbon peak is present in the SIMS profile for the silicon nitride film located between two SiCN interfacial layers than for the silicon nitride film including the impurity level carbon layer, which indicates that the SiCN interfacial layer located at the surface has a significantly higher carbon concentration than impurity carbon levels introduced by surface contamination and/or exposure of samples to air. The SIMS profiles illustrated in FIG. 15 demonstrate that the SiCN interfacial layer 543 can have a sufficiently high concentration of carbon atoms to effectively suppress etching by 100:1 dilute hydrofluoric acid.

Figure 16:
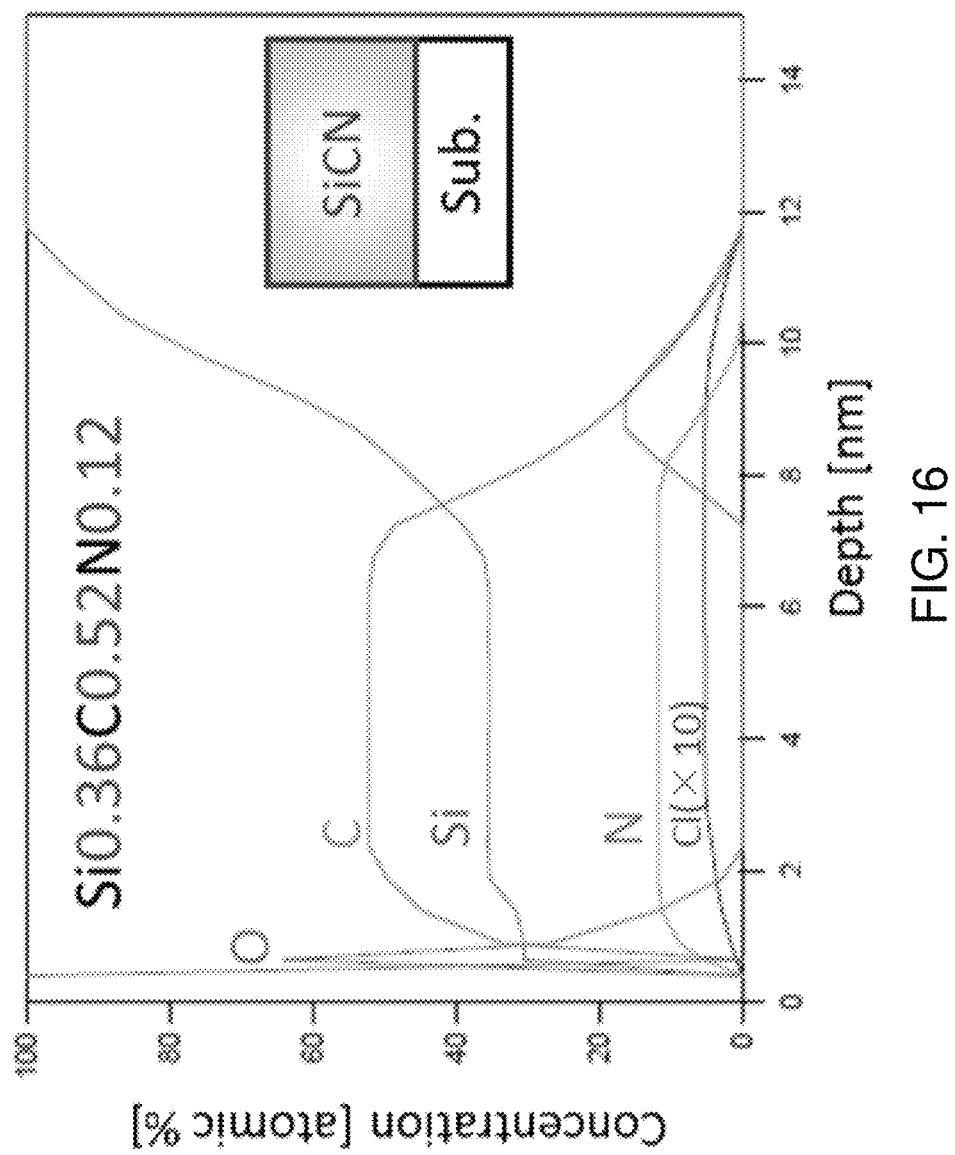
FIG. 16 shows a Rutherford back scattering (RBS) profile for an SiCN film on a silicon substrate.

FIG. 16 shows a Rutherford back scattering (RBS) profile for an SiCN film on a silicon substrate. The SiCN film was formed by flowing a silicon precursor gas and a carbon precursor gas into a process chamber to form a silicon-carbon alloy layer and by nitridating the silicon-carbon alloy layer. An atomic carbon concentration of about 50% was achieved in the SiCN film. The composition of the SiCN film formed by the methods of various embodiments of the present disclosure is $Si_{0.36}C_{0.53}N_{0.12}$ as determined by the RBS profile shown in FIG. 16. The SiCN material is not a dielectric material at this composition, but is a semiconducting material.

Figure 17:
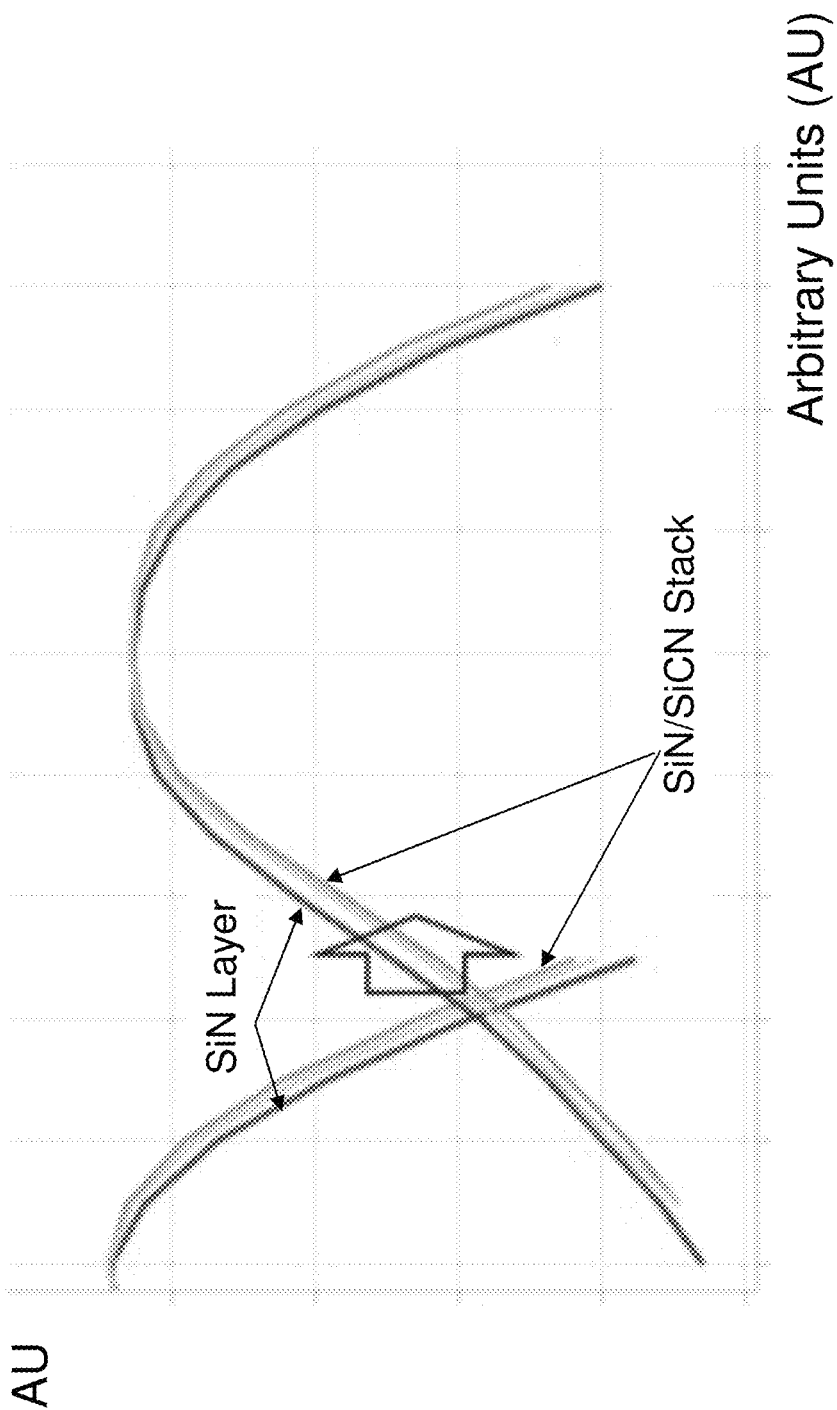
FIG. 17 shows a comparison between write/erase high temperature data retention (HTDR) test results of memory cells using a silicon nitride layer as a charge storage layer and memory cells using a SiN/SiCN stack of the embodiments of present disclosure as a charge storage layer as a function of a test voltage.

FIG. 17 shows a comparison between write/erase high temperature data retention (HTDR) test results of memory cells using a silicon nitride layer as a charge storage layer and memory cells using an SiN/SiCN stack of an embodiment of the present disclosure as a charge storage layer as a function of a test voltage. In the SiN/SiCN stack, a thin SiCN layer is added between the silicon nitride charge storage (i.e., charge trapping) layer and the tunneling dielectric. The memory cells using the SiN/SiCN stack displays a comparable level of high temperature data retention endurance as memory cells using a silicon nitride layer at a higher programming voltage. Thus, data retention at high programming voltages can be enhanced by using the SiN/SiCN stack of an embodiment of the present disclosure. Additional testing shows that the silicon carbon nitride interfacial layer 543 provided between the silicon nitride layer 542 and the tunneling dielectric layer 56 is the predominant reason for improvement in the write-erase data retention in memory cells using the SiN/SiCN stack. The backside silicon carbon nitride interfacial layer 541 has a lesser impact on the improvement in the write-erase data retention in the memory cells using the SiN/SiCN stack. The improvement in the write-erase data retention in the memory cells using the SiN/SiCN stack memory cells using the SiN/SiCN stack is believed to be due to suppression of silicon nitride-silicon oxide mixing by the SiCN interfacial layers (543, 541).

Referring to all drawings and according to various embodiments of the present disclosure, a three-dimensional memory device is provided, which comprises an alternating stack of insulating layers 32 and electrically conductive layers 46 located over a substrate (9, 10); and memory stack structures 55 extending through the alternating stack (32, 46), wherein: each of the memory stack structures 55 comprises a memory film 50 and a vertical semiconductor channel 60 contacting an inner sidewall of the memory film 50; and the memory film 50 comprises a silicon nitride layer 542, a tunneling dielectric layer 56, and a silicon carbon nitride interfacial layer 543 located between the silicon nitride layer 542 and the tunneling dielectric layer 56.

In one embodiment, the silicon carbon nitride interfacial layer 543 comprises a semiconducting material having electrical conductivity in a range from $1.0 \times 10^{-6}$ S/cm to $1.0 \times 10^{5}$ S/cm.

In one embodiment, the silicon carbon nitride interfacial layer 543 comprises nitrogen atoms at an atomic concentration less than 20%. In one embodiment, the silicon carbon nitride interfacial layer 543 comprises carbon atoms at an atomic concentration greater than 30%. In one embodiment, the silicon carbon nitride interfacial layer has a thickness less than 1 nm, such as 2 to 9 Angstroms.

In one embodiment, the tunneling dielectric layer 56 comprises an ONO stack including a first silicon oxide layer, a silicon oxynitride layer, and a second silicon oxide layer. In one embodiment, the memory film 50 comprises a blocking dielectric layer 52 that laterally surrounds the silicon nitride layer 542 and is laterally surrounded by the alternating stack (32, 46). In one embodiment, the memory film 50 comprises a backside silicon carbon nitride interfacial layer 541 contacting an inner sidewall of the blocking dielectric layer 52. Alternatively, the silicon nitride layer 542 contacts an inner sidewall of the blocking dielectric layer 52. In one embodiment, the blocking dielectric layer 52 comprises a silicon oxide layer.

In one embodiment, the alternating stack (32, 46) comprises a terrace region in which each electrically conductive layer 46 other than a topmost electrically conductive layer 46 within the alternating stack (32, 46) laterally extends farther than any overlying electrically conductive layer 46 within the alternating stack (32, 46); the terrace region includes stepped surfaces of the alternating stack (32, 46) that continuously extend from a bottommost layer within the alternating stack (32, 46) to a topmost layer within the alternating stack (32, 46); and support pillar structures 20 extend through a retro-stepped dielectric material portion 65 that overlies the stepped surfaces and a portion of the alternating stack (32, 46) that underlie the stepped surfaces.

The exemplary structures can include a three-dimensional memory device. In one embodiment, the three-dimensional memory device comprises a monolithic three-dimensional NAND memory device. The electrically conductive layers 46 can comprise, or can be electrically connected to, a respective word line of the monolithic three-dimensional NAND memory device. The substrate (9, 10) can comprise a silicon substrate. The vertical NAND memory device can comprise an array of monolithic three-dimensional NAND strings over the silicon substrate. At least one memory cell (comprising a portion of a silicon nitride layer 542 at a level of an electrically conductive layer 46) in a first device level of the array of monolithic three-dimensional NAND strings can be located over another memory cell (comprising another portion of the silicon nitride layer 542 at a level of another electrically conductive layer 46) in a second device level of the array of monolithic three-dimensional NAND strings. The silicon substrate can contain an integrated circuit comprising a driver circuit (comprising a subset of the least one semiconductor device 700) for the memory device located thereon. The electrically conductive layers 46 can comprise a plurality of control gate electrodes having a strip shape extending substantially parallel to the top surface of the substrate (9, 10), e.g., between a pair of backside trenches 79. The plurality of control gate electrodes comprises at least a first control gate electrode located in a first device level and a second control gate electrode located in a second device level. The array of monolithic three-dimensional NAND strings can comprise: a plurality of semiconductor channels (59, 11, 60), wherein at least one end portion 60 of each of the plurality of semiconductor channels (59, 11, 60) extends substantially perpendicular to a top surface of the substrate (9, 10) and comprising a respective one of the vertical semiconductor channels 60; and a plurality of charge storage elements (comprising portions of the memory films 50, i.e., portions of the silicon nitride layer 542). Each charge storage element can be located adjacent to a respective one of the plurality of semiconductor channels (59, 11, 60).

Referring to all drawings and according to various embodiments of the present disclosure, a method of forming a three-dimensional memory device is provided, which comprises forming an alternating stack of insulating layers and spacer material layers located over a substrate, wherein the spacer material layers are formed as, or are subsequently replaced with, electrically conductive layers, forming memory openings through the alternating stack, and forming a memory stack structure within each memory opening, wherein each memory stack structure comprises a memory film and a vertical semiconductor channel and each memory film is formed by: forming a silicon nitride layer over a sidewall of a respective memory opening; forming a silicon carbon nitride interfacial layer on the silicon nitride layer; and forming a tunneling dielectric layer on the silicon carbon nitride interfacial layer.

In one embodiment the silicon carbon nitride interfacial layer is formed by adsorbing carbon atoms on a surface of the silicon nitride layer by subjecting the surface of the silicon nitride layer to an ambient that includes a carbon precursor gas, and subjecting adsorbed carbon atoms to an ambient including a silicon precursor gas at a reaction temperature that induces reaction of silicon atoms in the silicon precursor gas, the adsorbed carbon atoms, and nitrogen atoms at a surface of the silicon nitride layer. In the embodiment method, the carbon precursor gas is selected from methane, acetylene, ethylene, ethane, propadiene, propene, and propane; the silicon precursor gas is selected from disilane, chloridisilanes, trisilane, and chloritrisilanes; and the reaction temperature is in a range from 600 degrees Celsius to 1,000 degrees Celsius. In the embodiment method, forming the silicon carbon nitride interfacial layer on the silicon nitride layer comprises forming a semiconducting material having electrical conductivity in a range from $1.0 \times 10^{-6}$ S/cm to $1.0 \times 10^{5}$ S/cm. In the embodiment method, forming the silicon carbon nitride interfacial layer comprises forming the silicon carbon nitride interfacial layer such that nitrogen atoms at an atomic concentration less than 20%. In the embodiment method, forming the silicon carbon nitride interfacial layer comprises forming the silicon carbon nitride interfacial layer such that the silicon carbon nitride interfacial layer comprises carbon atoms at an atomic concentration greater than 40%, and the silicon carbon nitride interfacial layer has a thickness less than 1 nm.

In one embodiment, forming the tunneling dielectric layer comprises forming an ONO stack including a first silicon oxide layer directly on the silicon carbon nitride interfacial layer, a silicon oxynitride layer, and a second silicon oxide layer.

One embodiment further further forming a blocking dielectric layer over the sidewall of the respective opening, wherein forming the silicon nitride layer over a sidewall of a respective memory opening comprises forming the silicon nitride layer over the blocking dielectric layer. In one embodiment the method further comprises forming a backside silicon carbon nitride interfacial layer directly on an inner sidewall of the blocking dielectric layer, wherein forming the silicon nitride layer over a sidewall of a respective memory opening comprises forming the silicon nitride layer directly on the backside silicon carbon nitride interfacial layer.

The structure and methods of the present disclosure can significantly improve retention data during write/erase cycles without inducing adverse side effects. Formation of the SiCN interfacial layers (541, 543) can be performed in-situ in a same deposition chamber that deposits the silicon nitride layer 542, such as a low pressure chemical vapor deposition furnace. As such, the impact on turn-around time (TAT) of the processing steps using to form the backside silicon carbon nitride interfacial layer 541 and the silicon carbon nitride interfacial layer 543 can be minimal. The silicon carbon nitride interfacial layer prevents mixing of silicon nitride and silicon oxide, and increases the data retention of charge storage elements including portions of the silicon nitride layer.

Although the foregoing refers to particular preferred embodiments, it will be understood that the claims are not so limited. Various modifications may be made to the disclosed embodiments and that such modifications are intended to be within the scope of the claims. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device, comprising:
    an alternating stack of insulating layers and electrically conductive layers located over a substrate; and
    memory stack structures extending through the alternating stack,
    wherein:
        each of the memory stack structures comprises a memory film and a vertical semiconductor channel contacting an inner sidewall of the memory film; and
        the memory film comprises a silicon nitride layer, a tunneling dielectric layer, and a silicon carbon nitride interfacial layer located between the silicon nitride layer and the tunneling dielectric layer.

2. The three-dimensional memory device of claim 1, wherein the silicon carbon nitride interfacial layer comprises a semiconducting material having electrical conductivity in a range from $1.0 \times 10^{-6}$ S/cm to $1.0 \times 10^{5}$ S/cm.

3. The three-dimensional memory device of claim 1, wherein the silicon carbon nitride interfacial layer comprises nitrogen atoms at an atomic concentration less than 20%.

4. The three-dimensional memory device of claim 1, wherein the silicon carbon nitride interfacial layer comprises carbon atoms at an atomic concentration greater than 30%.

5. The three-dimensional memory device of claim 1, wherein the silicon carbon nitride interfacial layer has a thickness less than 1 nm.

6. The three-dimensional memory device of claim 1, wherein the tunneling dielectric layer comprises an ONO stack including a first silicon oxide layer, a silicon oxynitride layer, and a second silicon oxide layer.

7. The three-dimensional memory device of claim 1, wherein the memory film comprises a blocking dielectric layer that laterally surrounds the silicon nitride layer and is laterally surrounded by the alternating stack.

8. The three-dimensional memory device of claim 7, wherein the memory film comprises a backside silicon carbon nitride interfacial layer contacting an inner sidewall of the blocking dielectric layer.

9. The three-dimensional memory device of claim 7, wherein the silicon nitride layer contacts an inner sidewall of the blocking dielectric layer.

10. The three-dimensional memory device of claim 7, wherein the blocking dielectric layer comprises a silicon oxide layer.

11. The three-dimensional memory device of claim 1, wherein:
    the alternating stack comprises a terrace region in which each electrically conductive layer other than a topmost electrically conductive layer within the alternating stack laterally extends farther than any overlying electrically conductive layer within the alternating stack;
    the terrace region includes stepped surfaces of the alternating stack that continuously extend from a bottommost layer within the alternating stack to a topmost layer within the alternating stack; and
    support pillar structures extend through a retro-stepped dielectric material portion that overlies the stepped surfaces and a portion of the alternating stack that underlie the stepped surfaces.

12. The three-dimensional memory device of claim 1, wherein the silicon carbon nitride interfacial layer contacts the tunneling dielectric layer.

13. The three-dimensional memory device of claim 1, wherein the memory film comprises a blocking dielectric layer located between the electrically conductive layers and the silicon nitride layer.

14. The three-dimensional memory device of claim 13, wherein the memory film comprises an additional silicon carbon nitride interfacial layer located between the blocking dielectric layer and the insulating layers and the electrically conductive layers of the alternating stack.

15. The three-dimensional memory device of claim 1, wherein the memory film vertically extends through insulating layers and the electrically conductive layers of the alternating stack.

16. The three-dimensional memory device of claim 1, wherein the tunneling dielectric layer contacts the vertical semiconductor channel.

17. The three-dimensional memory device of claim 1, wherein a bottom portion of the silicon carbon nitride interfacial layer comprises a surface that contacts the vertical semiconductor channel.

18. The three-dimensional memory device of claim 1, wherein the silicon carbon nitride interfacial layer comprises carbon atoms at an atomic concentration greater than 30%, and comprises silicon atoms at an atomic concentration greater than 25%.

19. The three-dimensional memory device of claim 1, wherein a percentage of silicon atoms in the silicon carbon nitride interfacial layer is greater than a percentage of nitrogen atoms in the silicon carbon nitride interfacial layer and is lesser than a percentage of carbon atoms in the silicon carbon nitride interfacial layer.

* * * * *